(12) United States Patent
Baeck et al.

(10) Patent No.: US 12,027,631 B2
(45) Date of Patent: Jul. 2, 2024

(54) THIN FILM TRANSISTOR COMPRISING ACTIVE LAYER HAVING THICKNESS DIFFERENCE AND DISPLAY APPARATUS COMPRISING THE SAME

(71) Applicant: LG DISPLAY CO., LTD., Seoul (KR)

(72) Inventors: JuHeyuck Baeck, Paju-si (KR); Dohyung Lee, Paju-si (KR); ChanYong Jeong, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 18/204,224

(22) Filed: May 31, 2023

(65) Prior Publication Data
US 2023/0307548 A1    Sep. 28, 2023

Related U.S. Application Data

(60) Division of application No. 17/498,246, filed on Oct. 11, 2021, now Pat. No. 11,728,436, which is a
(Continued)

(30) Foreign Application Priority Data

Dec. 28, 2018   (KR) .................. 10-2018-0172770

(51) Int. Cl.
*H01L 29/786*  (2006.01)
*H01L 27/12*   (2006.01)
(Continued)

(52) U.S. Cl.
CPC ...... *H01L 29/7869* (2013.01); *H01L 27/1225* (2013.01); *H01L 29/78603* (2013.01);
(Continued)

(58) Field of Classification Search
None
See application file for complete search history.

(56) References Cited

U.S. PATENT DOCUMENTS

| 11,171,245 B2 | 11/2021 | Baeck et al. |
| 2003/0080337 A1 | 5/2003 | Yudasaka et al. |

(Continued)

FOREIGN PATENT DOCUMENTS

| CN | 104854706 A | 8/2015 |
| CN | 108022978 A | 5/2018 |

(Continued)

OTHER PUBLICATIONS

Chinese Office Action dated Feb. 28, 2023, issued in Patent Application No. 201911323292.1 (8 pages).

(Continued)

*Primary Examiner* — Daniel Whalen
(74) *Attorney, Agent, or Firm* — POLSINELLI PC

(57) ABSTRACT

A thin film transistor is disclosed. The thin film transistor comprises an active layer, and a gate electrode overlapped with the active layer, wherein the active layer includes a channel portion overlapped with the gate electrode, and the channel portion includes a source boundary portion, a drain boundary portion, and a main channel portion, wherein at least a part of the drain boundary portion have a relatively smaller thickness in comparison to a thickness of the main channel portion. Also, according to one embodiment of the present disclosure, a display apparatus comprising the thin film transistor is provided.

16 Claims, 20 Drawing Sheets

Related U.S. Application Data continuation of application No. 16/519,577, filed on Jul. 23, 2019, now Pat. No. 11,171,245.

(51) Int. Cl.
*H10K 59/121* (2023.01)
*H10K 59/126* (2023.01)

(52) U.S. Cl.
CPC .. *H01L 29/78633* (2013.01); *H01L 29/78696* (2013.01); *H10K 59/1213* (2023.02); *H10K 59/126* (2023.02)

(56) References Cited

U.S. PATENT DOCUMENTS

| | | | |
|---|---|---|---|
| 2007/0029614 A1 | 2/2007 | Shiota et al. | |
| 2010/0044699 A1* | 2/2010 | Chung | H01L 29/78618 257/43 |
| 2012/0138942 A1 | 6/2012 | Segawa | |
| 2014/0103332 A1 | 4/2014 | Ahn et al. | |
| 2018/0006056 A1 | 1/2018 | Bae | |
| 2018/0130827 A1 | 5/2018 | Lee | |
| 2018/0175072 A1* | 6/2018 | Kim | H01L 29/78696 |
| 2019/0189805 A1 | 6/2019 | Jang | |

FOREIGN PATENT DOCUMENTS

| | | |
|---|---|---|
| EP | 3 340 313 A1 | 6/2018 |
| EP | 3 499 582 A1 | 6/2019 |
| JP | H08-172199 A | 7/1996 |
| KR | 10-2005-0009511 A | 1/2005 |
| KR | 10-2014-0048746 A | 4/2014 |
| KR | 10-2018-0050478 A | 5/2018 |

OTHER PUBLICATIONS

Korean Office Action dated Feb. 14, 2023, issued in Patent Application No. 10-2018-0172770 (7 pages).

German Office Action dated Jul. 7, 2022, issued in Patent Application No. 10-2019-133-982-0 (10 pages).

* cited by examiner

THIN FILM TRANSISTOR COMPRISING ACTIVE LAYER HAVING THICKNESS DIFFERENCE AND DISPLAY APPARATUS COMPRISING THE SAME

CROSS-REFERENCE TO RELATED APPLICATIONS

This application is a divisional of U.S. patent application Ser. No. 17/498,246, filed on Oct. 11, 2021, which is a continuation of U.S. patent application Ser. No. 16/519,577, filed Jul. 23, 2019, now U.S. Pat. No. 11,171,245, issued on Nov. 9, 2021, which claims the priority of the Korean Patent Application No. 10-2018-0172770 filed on Dec. 28, 2018, which are hereby incorporated by reference in their entirety for all purposes as if fully set forth herein.

BACKGROUND

Field of the Disclosure

The present disclosure relates to a display apparatus, and more particularly to a thin film transistor comprising an active layer having a thickness difference and a display apparatus comprising the thin film transistor. Although the present disclosure is suitable for a wide scope of applications, it is particularly suitable for constantly maintaining a threshold voltage of the oxide semiconductor thin film transistor by using an oxide semiconductor layer as the active layer of the thin film transistor for the display apparatus.

Description of the Background

A transistor is generally used as a switching device or a driving device in electronic devices. Especially, a thin film transistor is manufactured on a glass substrate or a plastic substrate because it can be widely used as a switching device in a display apparatus such as a liquid crystal display device and an organic light emitting device.

Depending on a material used for an active layer, the thin film transistor may be largely categorized into an amorphous silicon thin film transistor having an active layer of amorphous silicon, a polycrystalline silicon thin film transistor having an active layer of polycrystalline silicon and an oxide semiconductor thin film transistor having an active layer of oxide semiconductor.

In case of the oxide semiconductor thin film transistor (hereinafter referred to as "oxide semiconductor TFT"), an oxide for an active layer may be manufactured in a film type at a relatively low temperature, may have a high mobility, and may have a large resistance change with variations in an oxygen content included in an oxide semiconductor layer. Accordingly, desired properties of the oxide semiconductor TFT can be readily achieved. Also, the oxide semiconductor layer is transparent owing to the properties of oxide. By using the oxide semiconductor TFT, it is favorable to realization of a transparent display apparatus.

Accordingly, the oxide semiconductor TFT may be used as a switching device or a driving device of a display apparatus. However, a threshold voltage can be changed by hydrogen (H) which can permeate into the oxide semiconductor layer when the thin film transistor is driven. If the threshold voltage is varied, the driving of thin film transistor cannot be constant, and reliability of the thin film transistor is lowered. Also, if the threshold voltage of the thin film transistor is changed, luminance of the display apparatus using this thin film transistor is partially elevated so that picture quality of the display device is deteriorated. Thus, it is necessary to constantly maintain the threshold voltage of the oxide semiconductor thin film transistor using the oxide semiconductor layer as the active layer.

SUMMARY

The present disclosure has been made in view of the above problems and is to provide an oxide semiconductor thin film transistor capable of preventing a change of a threshold voltage.

The present disclosure to provide an oxide semiconductor thin film transistor which facilitates to prevent a change of a threshold voltage by reducing a thickness in a drain boundary portion of a channel portion.

In addition, the present disclosure to provide an oxide semiconductor thin film transistor which facilitates to prevent a change of a threshold voltage by reducing a thickness in a part of an insulating layer overlapped with a drain boundary portion of a channel portion so as to reduce an amount of hydrogen provided from the insulating layer to an active layer.

Further, the present disclosure to provide a display apparatus comprising an oxide semiconductor thin film transistor capable of preventing a change of a threshold voltage.

In accordance with an aspect of the present disclosure, the above and other can be accomplished by the provision of A thin film transistor includes an active layer including a channel portion; a gate electrode spaced apart from the active layer and overlapping at least a part of the active layer; and source and drain electrodes connected with the active layer and spaced apart from each other, wherein the channel portion includes, a first boundary portion connected with one of the source and drain electrodes; a second boundary portion connected with the other one of the source and drain electrodes; and a main channel portion interposed between the first boundary portion and the second boundary portion, and wherein at least a part of the second boundary portion has a thickness smaller than a thickness of the main channel portion.

The source boundary portion may have the same thickness as that of the main channel portion.

At least a part of the drain boundary portion may have a thickness of 50% or less than 50% in comparison to a thickness of the main channel portion.

The active layer may be disposed on a buffer insulating layer, and at least a part of the buffer insulating layer overlapping the drain boundary portion may have a relatively smaller thickness in comparison to a thickness in other part of the buffer insulating layer overlapping the main channel portion.

The buffer insulating layer may include a first insulating layer, and a second insulating layer on the first insulating layer, wherein at least a part of the first insulating layer overlapping the drain boundary portion have a relatively smaller thickness in comparison to a thickness in other part of the first insulating layer overlapping the main channel portion.

The first insulating layer may include silicon nitride.

The buffer insulating layer may be disposed on a substrate, and a metal pattern layer may be additionally provided between the substrate and the buffer insulating layer.

The thin film transistor may further comprise a gate insulating layer between the active layer and the gate electrode, wherein the gate insulating layer has a thickness profile which corresponds to that of the drain boundary portion in an area overlapped with the drain boundary portion.

The gate electrode may have a thickness profile which corresponds to that of the drain boundary portion in an area overlapped with the drain boundary portion.

The active layer may include a first conducting portion which is not overlapped with the gate electrode, and a second conducting portion which is spaced apart from the first conducting portion and is not overlapped with the gate electrode, wherein the first conducting portion is connected with the source boundary portion, and the second conducting portion is connected with the drain boundary portion.

The second conducting portion may have a relatively smaller thickness in comparison to a thickness of the main channel portion.

The second conducting portion may have the same thickness as that of the drain boundary portion.

The active layer may be disposed on the buffer insulating layer, and at least a part of the buffer insulating layer overlapping the second conducting portion may have a relatively smaller thickness in comparison to a thickness in other part of the buffer insulating layer overlapping the main channel portion.

The active layer may include a first oxide semiconductor layer, and a second oxide semiconductor layer on the first oxide semiconductor layer.

In accordance with another aspect of the present disclosure, there is provided a thin film transistor comprising a buffer insulating layer, an active layer on the buffer insulating layer, a gate electrode configured to be spaced from the active layer and overlapped with at least a part of the active layer, a source electrode connected with the active layer, and a drain electrode configured to be spaced from the source electrode and connected with the active layer, wherein the active layer includes a channel portion overlapped with the gate electrode, wherein the channel portion includes a source boundary portion connected with the source electrode, a drain boundary portion connected with the drain electrode, and a main channel portion between the source boundary portion and the drain boundary portion, wherein at least a part of the buffer insulating layer overlapping the drain boundary portion has a relatively smaller thickness in comparison to a thickness in other part of the buffer insulating layer overlapping the main channel portion.

In accordance with another aspect of the present disclosure, there is provided a display apparatus comprising a substrate, a pixel driving circuit on the substrate, and a display unit connected with the pixel driving circuit, wherein the pixel driving circuit includes at least one thin film transistor, wherein the thin film transistor includes an active layer, a gate electrode configured to be spaced from the active layer and overlapped with at least a part of the active layer, a source electrode connected with the active layer, and a drain electrode configured to be spaced from the source electrode and connected with the active layer, wherein the active layer includes a channel portion overlapped with the gate electrode, wherein the channel portion includes a source boundary portion connected with the source electrode, a drain boundary portion connected with the drain electrode, and a main channel portion between the source boundary portion and the drain boundary portion, wherein at least a part of the drain boundary portion have a relatively smaller thickness in comparison to a thickness of the main channel portion.

In accordance with a further aspect of the present disclosure, there is provided a thin film transistor includes a substrate; an active layer including a main channel portion adjacent to a source boundary portion and a drain boundary portion, a first conducting portion adjacent to the source boundary portion, and a second conducting portion adjacent to the drain boundary portion; a first insulating layer on the substrate; a second insulating layer on the first insulating layer; a source electrode connected with the source boundary portion; and a drain electrode connected with the drain boundary portion, wherein at least one part of the first insulating layer that overlaps the drain boundary portion has a thickness smaller than a thickness of another part of the first insulating layer that overlaps the main channel portion.

The display apparatus may further comprise a buffer insulating layer between the substrate and the active layer, wherein at least a part of the buffer insulating layer overlapping the drain boundary portion has a relatively smaller thickness in comparison to a thickness in other part of the buffer insulating layer overlapping the main channel portion.

The buffer insulating layer may include a first insulating layer, and a second insulating layer on the first insulating layer, wherein at least a part of the first insulating layer overlapping the drain boundary portion has a relatively smaller thickness in comparison to a thickness in other part of the first insulating layer overlapping the main channel portion.

According to one aspect of the present disclosure, the active layer has a thickness difference so that it is possible to restrict a flow of carrier, to thereby prevent a change of a threshold voltage in the thin film transistor.

According to another aspect of the present disclosure, a part of the insulating layer overlapped with the drain boundary portion of the active layer is reduced in thickness so that it is possible to reduce an amount of hydrogen which migrates to the active layer from the insulating layer. As a result, even though a high voltage is applied to the gate electrode, it is possible to prevent a change of a threshold voltage in the thin film transistor.

According to another aspect of the present disclosure, the oxide semiconductor thin film transistor configured to prevent a change of a threshold voltage is included in a display apparatus so that it is possible to prevent a change of luminance, to thereby realize good display quality of the display apparatus.

In addition to the effects of the present disclosure as mentioned above, additional advantages and features of the present disclosure will be clearly understood by those skilled in the art from the description of the present disclosure.

BRIEF DESCRIPTION OF THE DRAWINGS

The accompanying drawings, which are included to provide a further understanding of aspects of the disclosure and are incorporated in and constitute a part of this application, illustrate aspect(s) of the disclosure and together with the description serve to explain the principle of aspects of the disclosure.

In the drawings.

DETAILED DESCRIPTION

Figure 1:
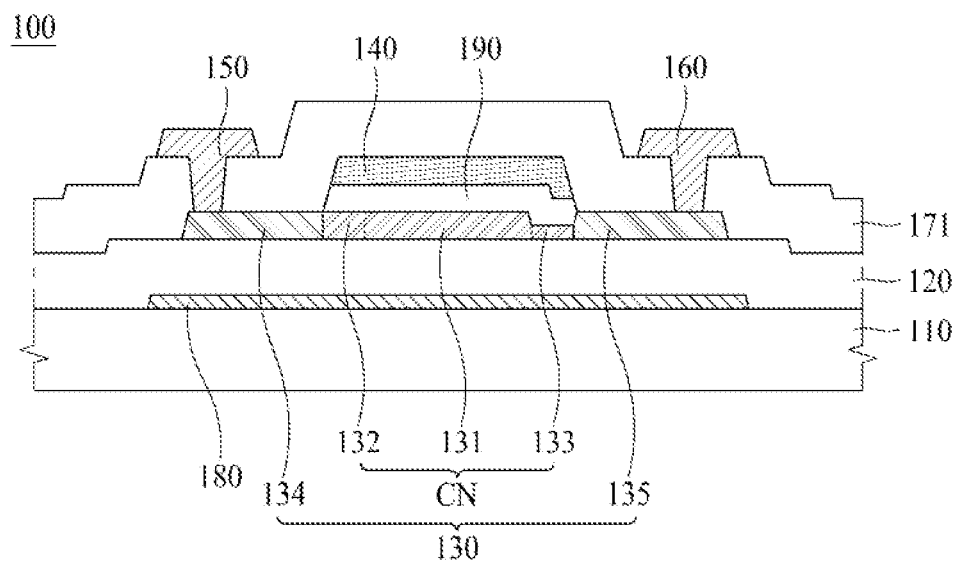
FIG. 1 is a cross-sectional view illustrating a thin film transistor according to one aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including a margin of error although there is no explicit description thereof.

In describing a positional relationship, for example, when the positional order is described as "on," "above," "below," "beneath", and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

In the drawings, the same or similar elements are denoted by the same reference numerals even though they are depicted in different drawings.

In the aspects of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

In one or more aspects of the present disclosure, for convenience of explanation, a source region is distinguished from a source electrode, and a drain region is distinguished from a drain electrode. However, aspects of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin film transistor 100 according to one aspect of the present disclosure.

Referring to FIG. 1, the thin film transistor 100 according to one aspect of the present disclosure includes an active layer 130, a gate electrode 140 configured to be spaced apart from the active layer 130 and to overlap at least a part of the active layer 130, a source electrode 150 connected with the active layer 130, and a drain electrode 160 configured to be spaced apart from the source electrode 150 and to be connected with the active layer 130.

The active layer 130 is disposed on a substrate 110.

The substrate 110 may be formed of glass or plastic. The substrate 110 may be formed of transparent plastic having flexibility, for example, polyimide.

A buffer insulating layer 120 is disposed on the substrate 110. The buffer insulating layer 120 may include at least one of silicon oxide and silicon nitride. The buffer insulating layer 120 protects the active layer 130 and planarizes an upper surface of the substrate 110. The buffer insulating layer 120 may correspond to an "insulating layer" according to one aspect of the present disclosure.

Referring to FIG. 1, a metal pattern layer 180 is interposed between the substrate 110 and the buffer insulating layer 120. The metal pattern layer 180 functions as a light shielding layer, and prevents external light which is incident on the active layer 130. Also, the metal pattern layer 180 may be a wiring that can transmit a current, a power, or a signal.

The active layer 130 includes an oxide semiconductor material. For example, the active layer 130 may include one of IZO(InZnO)-based oxide semiconductor material, IGO (InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO(GaZnSnO)-based oxide semiconductor material, GZO(GaZnO)-based oxide semiconductor material, GO(GaO)-based oxide semiconductor material, and ITZO(InSnZnO)-based oxide semiconductor material. However, one aspect of the present disclosure is not limited to the above. In addition to the above described materials, the active layer 130 may be formed of other oxide semiconductor materials generally known to those in the art. A detailed structure of the active layer 130 will be described as follows.

A gate insulating layer 190 is disposed on the active layer 130. The gate insulating layer 190 may include one of silicon oxide and silicon nitride, and may include a metal oxide or a metal nitride. The gate insulating layer 190 may have a single-layered structure or a multi-layered structure.

The gate insulating layer 190 may overlap the active layer 130. The gate insulating layer 190 may correspond to an "insulating layer" according to one aspect of the present disclosure.

A gate electrode 140 is disposed on the gate insulating layer 190. The gate electrode 140 is insulated from the active layer 130, and overlaps at least a part of the active layer 130.

The gate electrode 140 may include aluminum-based metal such as aluminum (Al) or aluminum alloy, argentums-based metal such as argentums (Ag) or argentums alloy, copper-based metal such as copper (Cu) or copper alloy, molybdenum-based metal such as molybdenum (Mo) or molybdenum alloy, chrome (Cr), tantalum (Ta), neodymium (Nd), and titanium (Ti). The gate electrode 140 may have a multi-layered structure including at least two conductive layers with the different physical properties.

An insulating interlayer 171 is disposed on the gate electrode 140. The insulating interlayer 171 may correspond to an insulating layer comprising an insulating material. In detail, the insulating interlayer 171 may be formed of an organic material or an inorganic material, or may be formed in a deposition structure of an organic material and an inorganic material.

The source electrode 150 and the drain electrode 160 are disposed on the insulating interlayer 171. The source electrode 150 and the drain electrode 160 are spaced apart from each other, and are respectively connected with the active layer 130. The source electrode 150 and the drain electrode 160 are respectively connected with the active layer 130 through contact holes provided in the insulating interlayer 171.

Each of the source electrode 150 and the drain electrode 160 may include at least one among molybdenum (Mo), aluminum (Al), chrome (Cr), aurum (Au), titanium (Ti), nickel (Ni), neodymium (Nd), copper (Cu), and their alloys. Each of the source electrode 150 and the drain electrode 160 may be formed in a single-layered structure of molybdenum (Mo), aluminum (Al), chrome (Cr), aurum (Au), titanium (Ti), nickel (Ni), neodymium (Nd), copper (Cu), or their alloys, or may be formed in a multi-layered structure having two or more layers among molybdenum (Mo), aluminum (Al), chrome (Cr), aurum (Au), titanium (Ti), nickel (Ni), neodymium (Nd), copper (Cu), and their alloys.

Hereinafter, the active layer 130 will be described in detail.

Referring back to FIG. 1, the active layer 130 includes a channel portion (CN) that vertically overlaps the gate electrode 140. Also, the active layer 130 includes a first conducting portion 134 and a second conducting portion 135 that do not overlap the gate electrode 140 and include conductors.

The first conducting portion 134 and the second conducting portion 135 may be obtained by conductivizing the active layer 130 except for the channel portion (CN). For example, a part of the active layer 130, which do not overlap the gate electrode 140, become conductivized by a plasma treatment or hydrogen treatment using the gate electrode 140 as a mask. Thus, the first conducting portion 134 and the second conducting portion 135 are formed, and the channel portion (CN) is formed in the non-conductivized portion that overlaps the gate electrode 140.

However, for the conductivizing process, a part of the channel portion (CN) that overlaps the gate electrode 140 and is positioned adjacent to the first conducting portion 134 or the second conducting portion 135 may be conductivized partially. Thus, the partially-conductivized portion of the channel portion (CN), which is positioned adjacent to the first conducting portion 134 or the second conducting portion 135, may be referred to as a boundary portion. According to one aspect of the present disclosure, the partially-conductivized portion positioned adjacent to the first conducting portion 134 toward the source electrode 150 may be referred to as a source boundary portion 132, and the partially-conductivized portion positioned adjacent to the second conducting portion 135 toward the drain electrode 160 may be referred to as a drain boundary portion 133.

The source boundary portion 132 and the drain boundary portion 133 may have a relatively higher carrier concentration in comparison to that of the channel portion (CN), and may have the Fermi level which is similar to that of each of the first conducting portion 134 and the second conducting portion 135. In a field effect transistor field, the source boundary portion 132 and the drain boundary portion 133 may be referred to as "ΔL regions" (shown in FIGS. 14A and 14B).

Each of the source boundary portion 132 and the drain boundary portion 133 may have a length corresponding to about 10 to 100 times of a thickness of a main channel portion 131. The length in each of the source boundary portion 132 and the drain boundary portion 133 may be defined by a distance from the edge of the channel portion (CN) to the inside of the channel portion (CN). For example, the length in each of the source boundary portion 132 and the drain boundary portion 133 may be about 30 to 70 times of the thickness of the main channel portion 131.

Again, referring back to FIG. 1, the channel portion (CN) may include the source boundary portion 132 connected with the source electrode 150, the drain boundary portion 133 connected with the drain electrode 160, and the main channel potion 131 interposed between the source boundary portion 132 and the drain boundary portion 133.

A channel of the active layer 130 is provided in the channel portion (CN). Especially, the main channel portion 131 actually serves as a main channel. The main channel portion 131 may be referred to as an effective channel region.

The source boundary portion 132 may be directly connected with the source electrode 150, or may be connected with the source electrode 150 via the first conducting portion 134. Also, the source boundary portion 132 may be connected with the source electrode 150 via the first conducting portion 134.

The drain boundary portion 133 may be directly connected with the drain electrode 160, or may be connected with the drain electrode 160 via the second conducting portion 135. The drain boundary portion 133 may be connected with the drain electrode 160 via the second conducting portion 135.

According to one aspect of the present disclosure, at least a part of the drain boundary portion 133 may have a relatively smaller thickness in comparison to a thickness of the main channel portion 131.

The active layer 130 according to one aspect of the present disclosure is an oxide semiconductor layer including an oxide semiconductor material. In driving the thin film transistor 100 including the active layer 130 of the oxide semiconductor material, a voltage applied to the drain electrode 160 is higher than a voltage applied to the source electrode 150.

In the active layer 130 of the oxide semiconductor material, hydrogen (H) provided from an insulating layer may be included in the boundaries between the main channel portion 131 corresponding to the effective channel region and the first and second conducting portions 134 and 135. In detail, a hydrogen (H) concentration included in the source boundary portion 132 and the drain boundary portion 133 is higher than that of the main channel portion 131, and an oxygen deficiency (Vo) may exist. In this case, if a high voltage is applied to the area between the gate electrode 140 and the drain electrode 160, hydrogen (H) is ionized in a part of the active layer 140 adjacent to the drain electrode 160 to which the high voltage is applied, thus the carrier concentration is increased therein. As a result, a drop of a threshold voltage may occur. If there is the drop of the threshold voltage, the threshold voltage is moved to the negative (−) direction.

If the threshold voltage is changed, it can lower driving stability and switching stability in the thin film transistor 100. In order to prevent the change of the threshold voltage, according to one aspect of the present disclosure, at least a part of the drain boundary portion 133 is designed to have a relatively smaller thickness in comparison to that of the main channel portion 131. As a result, even though a high voltage is applied to the area between the gate electrode 140 and the drain electrode 160, an excessive flow of carrier through the drain boundary portion 133 can be restricted so that the threshold voltage of the thin film transistor 100 is not moved to the negative (−) direction.

According to one aspect of the present disclosure, a thickness in a part of the drain boundary portion 133 may be smaller than a thickness of the main channel portion 131, and a total thickness of the drain boundary portion 133 may be smaller than a thickness of the main channel portion 131. Thus, according to one aspect of the present disclosure, the active layer 130 has a thickness difference.

According to one aspect of the present disclosure, a thickness of the source boundary portion 132 is not reduced. In detail, the source boundary portion 132 and the main channel portion 131 may have the same thickness.

According to one aspect of the present disclosure, at least a part of the drain boundary portion 133 have a thickness of 50% or less than 50% in comparison to a thickness of the main channel portion 131. These areas of the drain boundary portion 133 having a relatively smaller thickness can restrict an excessive flow of the carrier. If the thickness in these areas of the drain boundary portion 133 is more than 50% in comparison to the thickness of the main channel portion 131, an efficiency for the restriction of the carrier flow may be lowered. Accordingly, at least a part of the drain boundary portion 133 may be designed to have the thickness corresponding to 50% or less than 50% of the thickness of the main channel portion 131.

Meanwhile, if the thickness in at least a part of the drain boundary portion 133 is excessively small, it can lower film stability of the drain boundary portion 133 and also lower the electrical properties of the active layer 130. Thus, a part of the drain boundary portion 133, which are formed at the smallest thickness, may have the thickness of 20% or more than 20% in comparison to the thickness of the main channel portion 131. In more detail, in consideration of the film stability, a part of the drain boundary portion 133, which are formed at the smallest thickness, may have the thickness of 30% or more than 30% in comparison to the thickness of the main channel portion 131.

Thus, according to one aspect of the present disclosure, at least a part of the drain boundary portion 133 may have the thickness corresponding to 20%~50% in comparison to the thickness of the main channel portion 131, and more particularly, may have the thickness corresponding to 30%~50% in comparison to the thickness of the main channel portion 131.

In a patterning process to form the active layer 130, at least a part of the drain boundary portion 133 are etched so as to have a relatively smaller thickness in at least a part of the drain boundary portion 133 in comparison to other part of the active layer 130, thus at least a part of the drain boundary portion 133 may have a relatively smaller thickness in comparison to the thickness of the main channel portion 131.

For example, for the patterning process of the active layer 130 by an etching process using photoresist, a photoresist pattern having a predetermined thickness is formed on the drain boundary portion 133 by a selective exposure by using a halftone mask. Thus, it is possible to form the drain boundary portion 133 having a relatively smaller thickness in comparison to the thickness of the main channel portion 131.

Still referring to FIG. 1, the gate insulating layer 190 disposed between the active layer 130 and the gate electrode 140 has the same thickness profile as that of the drain boundary portion 133 in the area overlapping the drain boundary portion 133. In detail, the active layer 130 has a groove-shaped portion in the drain boundary portion 133, and the gate insulating layer 190 has a groove-shaped portion on the drain boundary portion 133. According to one aspect of the present disclosure, the thickness profile indicates a bent pattern in each layer with respect to a cross section.

In FIG. 1, the active layer 130 includes the first conducting portion 134 that does not overlap the gate electrode 140, and the second conducting portion 135 that does not overlap the gate electrode 140 and provides to be spaced from the first conducting portion 134.

The first conducting portion 134 is connected with the source boundary portion 132. Accordingly, the source boundary portion 134 is connected with the source electrode 150 via the first conducting portion 134.

The second conducting portion 135 is connected with the drain boundary portion 133. Accordingly, the drain boundary portion 133 is connected with the drain electrode 160 via the second conducting portion 135.

The first conducting portion 134 and the second conducting portion 135 may be formed by a selective conductivizing process of the active layer 130. For the conductivizing process, the areas for the first conducting portion 134 and the second conducting portion 135 may be treated with a plasma treatment or hydrogen treatment. However, one aspect of the present disclosure is not limited to these methods. For example, the first conducting portion 134 and the second conducting portion 135 may be formed by other methods generally known to those in the art.

According to one aspect of the present disclosure, the first conducting portion 134 is connected with the source electrode 150, and the second conducting portion 135 is connected with the drain electrode 160. The active layer 130 may be in electrical contact with the source electrode 150 and the drain electrode 160 via the first conducting portion 134 and the second conducting portion 135.

According to one aspect of the present disclosure, the first conducting portion 134 may be a source region, and the second conducting portion 135 may be a drain region. However, one aspect of the present disclosure is not limited to this structure. For example, the first conducting portion 134 may be a drain region, and the second conducting portion 135 may be a source region.

In one or more aspects of the present disclosure, for convenience of explanation, a source region is distinguished from a source electrode, and a drain region is distinguished from a drain electrode. However, aspects of the present disclosure are not limited to this structure. For example, a source region may be a source electrode, and a drain region may be a drain electrode. Also, a source region may be a drain electrode, and a drain region may be a source electrode.

Thus, according to one aspect of the present disclosure, the first conducting portion 134 may be a source electrode, and the second conducting portion 135 may be a drain electrode. Also, the first conducting portion 134 may be a drain electrode, and the second conducting portion 135 may be a source electrode.

Hereinafter, another aspect of the present disclosure will be described with reference to FIG. 2. In order to avoid a repetitive explanation, a detailed description for the same parts will be omitted.

Figure 2:
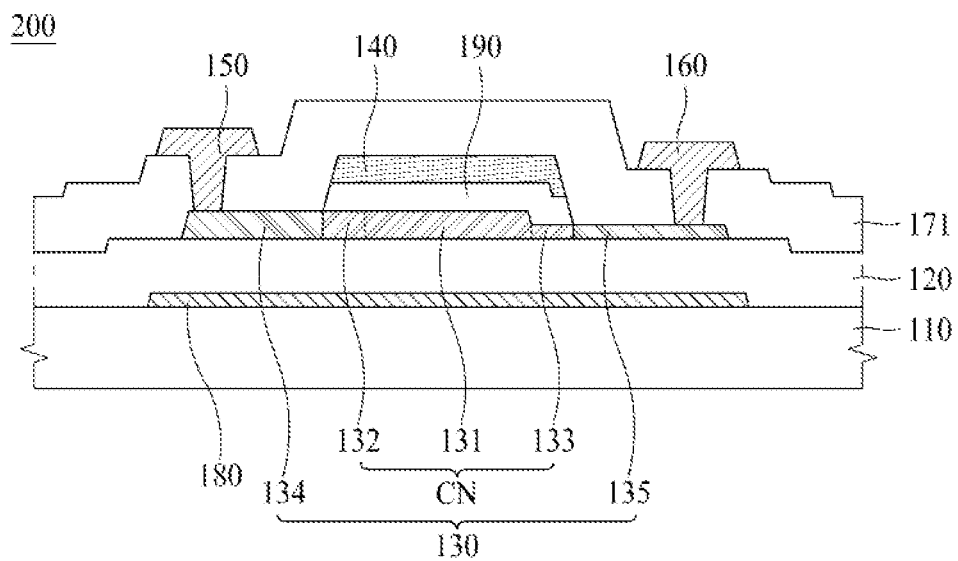
FIG. 2 is a cross-sectional view illustrating a thin film transistor according to another aspect of the present disclosure.

FIG. 2 is a cross-sectional view illustrating a thin film transistor 200 according to another aspect of the present disclosure.

Referring to FIG. 2, a second conducting portion 135 has a thickness which is smaller than that of a main channel portion 131. Also, the thickness of the second conducting portion 135 is the same as a thickness of a drain boundary portion 133.

In detail, in comparison to the thin film transistor 100 of FIG. 1, the thin film transistor of FIG. 2 includes the second conducting portion 135 having a thickness smaller than that of the main channel portion 131.

According to one aspect of the present disclosure, a main channel portion 131, a source boundary portion 132, a drain boundary portion 133, a first conducting portion 134 and a second conducting portion 135 constituting an active layer 130 are formed as one body. For example, in a step of patterning the active layer 130 by an etching process using photoresist, a photoresist pattern having a predetermined thickness is formed on the drain boundary portion 133 and the second conducting portion 135 by a selective exposure using a halftone mask. Therefore, it is possible to simultaneously form the drain boundary portion 133 and the second conducting portion 135 having a relatively smaller thickness in comparison to the main channel portion 131.

Figure 3:
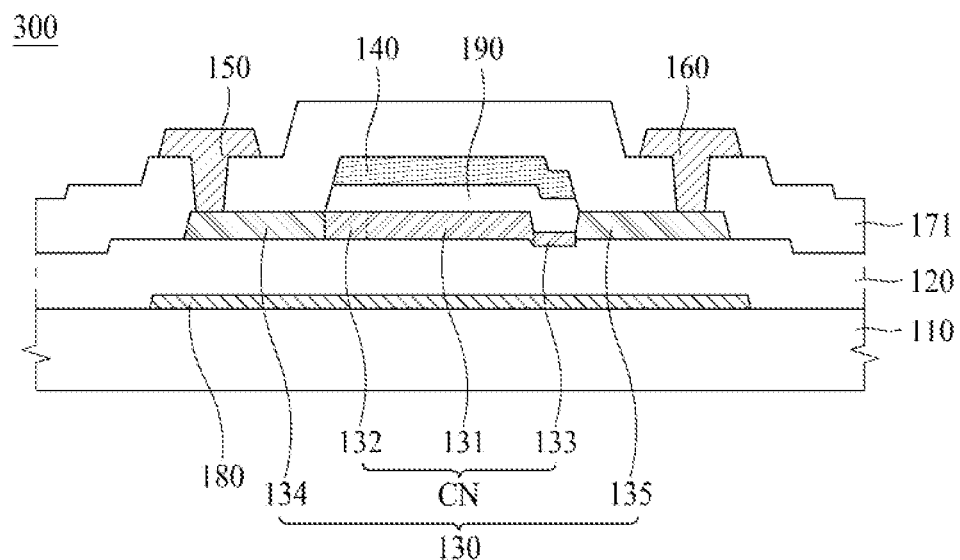
FIG. 3 is a cross-sectional view illustrating a thin film transistor according to another aspect of the present disclosure.

FIG. 3 is a cross-sectional view illustrating a thin film transistor 300 according to another aspect of the present disclosure.

Referring to FIG. 3, an active layer 130 is disposed on a buffer insulting layer 120 corresponding to an insulating layer, and a thickness in at least some of an overlap area between the buffer insulating layer 120 and a drain boundary portion 133 is smaller than a thickness of an overlap area between the buffer insulating layer 120 and a main channel portion 131.

For a process of forming the buffer insulating layer 120 or after the process of forming the buffer insulating layer 120, a part of the buffer insulating layer 120 to be provided with the drain boundary portion 133 are removed so that the overlap area between the buffer insulating layer 120 and the drain boundary portion 133 has a smaller thickness than the thickness of the overlap area between the buffer insulating layer 120 and the main channel portion 131.

Generally, the insulating layer such as the buffer insulating layer 120 includes hydrogen (H) therein. The hydrogen (H) included in the insulating layer migrates to the active layer 130 so that a hydrogen concentration of the active layer 130 may be raised. As a result, if a high voltage is applied to the area between a gate electrode 140 and a drain electrode 160, hydrogen (H) is ionized in the drain boundary portion 133 adjacent to the drain electrode 160, whereby a carrier concentration is raised, to thereby generate a drop of a threshold voltage.

In order to prevent the drop of the threshold voltage, the thickness of the overlap area between the buffer insulating layer 120 and the drain boundary portion 133 is reduced so that it is possible to reduce an amount of hydrogen (H) which migrates to the drain boundary portion 133 of the active layer 130 from the buffer insulating layer 120. As a result, even though the high voltage is applied to the area between the gate electrode 140 and the drain electrode 160, it is possible to prevent the drop of the threshold voltage.

According to one aspect of the present disclosure, a part of the buffer insulating layer 120 having the reduced thickness, which corresponds to the overlap area between the buffer insulating layer 120 and the drain boundary portion 133, may have the thickness of about 75% in comparison to the thickness of the overlap area between the buffer insulating layer 120 and the main channel portion 131. If the thickness in a part of the buffer insulating layer 120 having the reduced thickness is more than 75% in comparison to the thickness of the overlap area between the buffer insulating layer 120 and the main channel portion 131, an efficiency for reducing an amount of hydrogen (H) which migrates to the drain boundary portion 133 can be slightly made or can be hardly made. Accordingly, the area of the buffer insulating layer 120 to be overlapped with the drain boundary portion 133 is designed to have the thickness of 75% or less than 75% in comparison to the thickness in the area of the buffer insulating layer 120 to be overlapped with the main channel portion 131.

If the thickness in a part of the buffer insulating layer 120 having the reduced thickness is less than 30% in comparison to the thickness of the overlap area between the buffer insulating layer 120 and the main channel portion 131, it may lower film stability and also lower the insulating properties. Thus, the thickness in a part of the buffer insulating layer 120 having the reduced thickness is designed to be more than 30% in comparison to the thickness of the overlap area between the buffer insulating layer 120 and the main channel portion 131.

For example, a part of the buffer insulating layer 120 having the reduced thickness is designed to have the thickness corresponding to 30%~75% in comparison to the thickness of the overlap area between the buffer insulating layer 120 and the main channel portion 131, and more particularly, 30%~60% in comparison to the thickness of the overlap area between the buffer insulating layer 120 and the main channel portion 131.

Also, referring to FIG. 3, the gate electrode 140 may have the same thickness profile as that of the drain boundary portion 133 in the area overlapping the drain boundary portion 133. In detail, the active layer 130 has a groove-shaped portion in the drain boundary portion 133, and the gate electrode 140 has a groove-shaped portion on the drain boundary portion 133.

Figure 4:
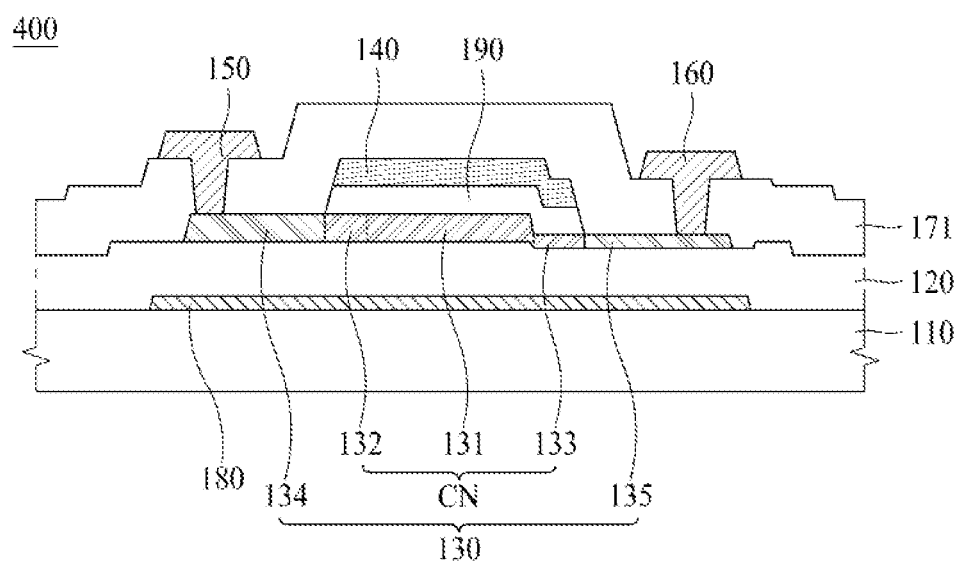
FIG. 4 is a cross-sectional view illustrating a thin film transistor according to another aspect of the present disclosure.

FIG. 4 is a cross-sectional view illustrating a thin film transistor 400 according to another aspect of the present disclosure.

Referring to FIG. 4, an active layer 130 is disposed on a buffer insulating layer 120 corresponding to an insulating layer, and at least a part of the buffer insulating layer 120 overlapping a second conducting portion 135 has a relatively smaller thickness in comparison to a thickness in other part of the buffer insulating layer 120 overlapping a main channel portion 131.

For example, a part of the buffer insulating layer 120 positioned below a drain boundary portion 133 and the second conducting portion 135 has a relatively smaller thickness than that in other part of the buffer insulating layer 120.

In the buffer insulating layer 120, the areas overlap the drain boundary portion 133 and the second conducting portion 135 are reduced in thickness so that it is possible to reduce an amount of hydrogen (H) which migrates to the drain boundary portion 133 of the active layer 130 from the buffer insulating layer 120. As a result, even though a high voltage is applied to the area between a gate electrode 140 and a drain electrode 160, it is possible to prevent a drop of a threshold voltage.

Figure 5:
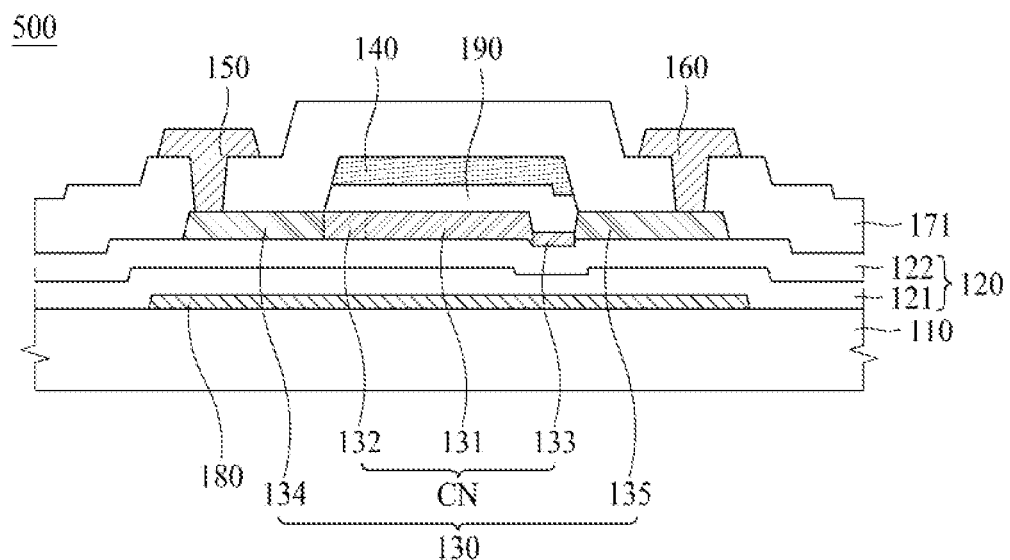
FIG. 5 is a cross-sectional view illustrating a thin film transistor according to another aspect of the present disclosure.

FIG. 5 is a cross-sectional view illustrating a thin film transistor 500 according to another aspect of the present disclosure.

According to another aspect of the present disclosure, a buffer insulating layer 120 includes a two-layered insulating layer. In detail, the buffer insulating layer 120 includes a first insulating layer 121, and a second insulating layer 122 on the first insulating layer 121. The first insulating layer 121 includes silicon nitride (SiNx), and the second insulating layer 122 includes silicon oxide (SiOx).

Referring to FIG. 5, at least a part of the first insulating layer 121 overlapping a drain boundary portion 133 has a relatively smaller thickness in comparison to a thickness in other part of the first insulating layer 121 overlapping a main channel portion 131.

The buffer insulating layer 120 functions as an insulating layer which insulates a metal pattern layer 180 and an active layer 130 from each other. If the metal pattern layer 180 is used as a conductive wiring, the metal pattern layer 180 may be formed of copper (Cu). In this case, in order to prevent copper deposit by a copper ion migration, the first insulating layer 121 being in contact with the metal pattern layer 180 is formed of silicon nitride (SiNx), and then the second insulating layer 122 of silicon oxide (SiOx) may be disposed on the first insulating layer 121.

The silicon nitride (SiNx) is capable of preventing the copper ion migration, however, the silicon nitride (SiNx) include a large amount of hydrogen (H). The hydrogen (H) included in the silicon nitride (SiNx) may migrate to the active layer 130, to thereby raise a hydrogen concentration in the active layer 130. Especially, if the hydrogen (H) included in the silicon nitride (SiNx) migrates to the drain boundary portion 133, a hydrogen concentration of the drain boundary portion 133 is raised, whereby it may cause a change of a threshold voltage.

In order to overcome this problem, according to another aspect of the present disclosure, at least a part of the first insulating layer 121 overlapping the drain boundary portion 133 has the relatively smaller thickness in comparison to the thickness in other part of the first insulating layer 121 overlapping the main channel portion 131.

Figure 6:
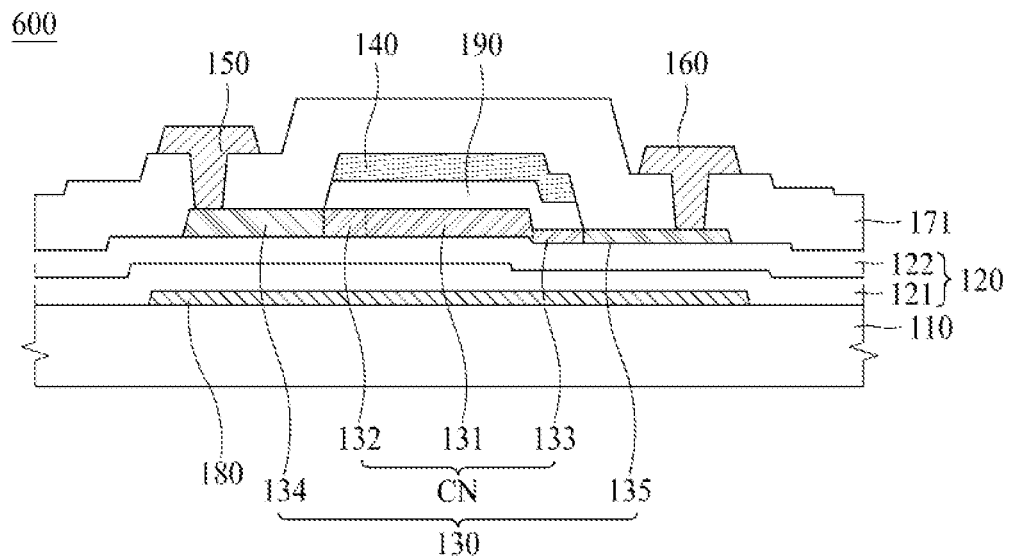
FIG. 6 is a cross-sectional view illustrating a thin film transistor according to one aspect of the present disclosure.

FIG. 6 is a cross-sectional view illustrating a thin film transistor 600 according to another aspect of the present disclosure.

Referring to FIG. 6, a buffer insulating layer 120 includes a first insulating layer 121, and a second insulating layer 122 on the first insulating layer 121, and a part of the first insulating layer 121 overlapping a drain boundary portion 133 and a second conducting portion 135 has a relatively smaller thickness in comparison to a thickness in other part of the first insulating layer 121 overlapping a main channel portion 131.

According as a part of the first insulating layer 121 overlapping the drain boundary portion 133 and the second conducting portion 135 has the relatively smaller thickness in comparison to the thickness in other part of the first insulating layer 121 overlapping the main channel portion 131, it is possible to reduce an amount of hydrogen (H) which migrates to the drain boundary portion 133 of an active layer 130 from the first insulating layer 121. As a result, even though a high voltage is applied to the area between a gate electrode 140 and a drain electrode 160, it is possible to prevent a drop of a threshold voltage.

Figure 7A:
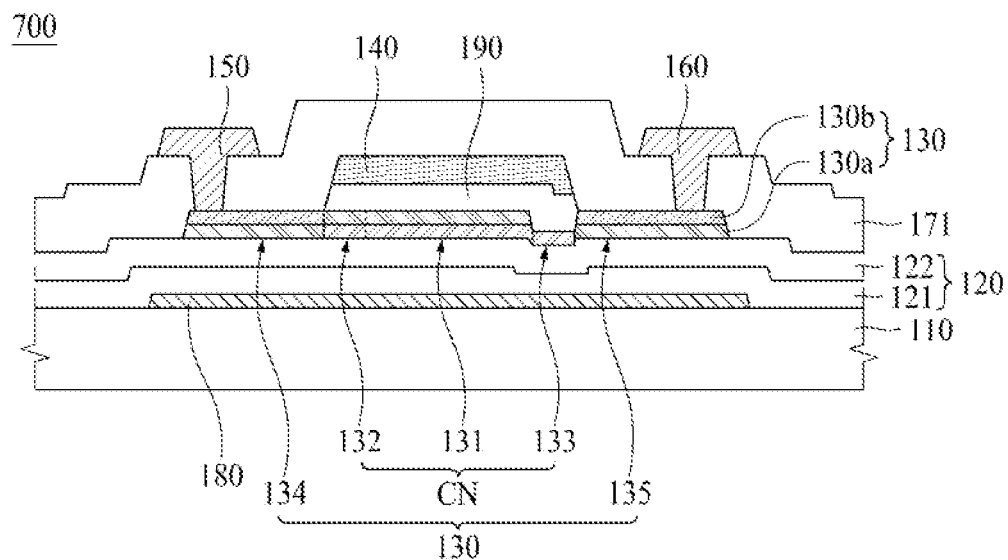
FIGS. 7A, 7B, and 7C are cross-sectional views illustrating a thin film transistor according to another aspect of the present disclosure.
Figure 7B:
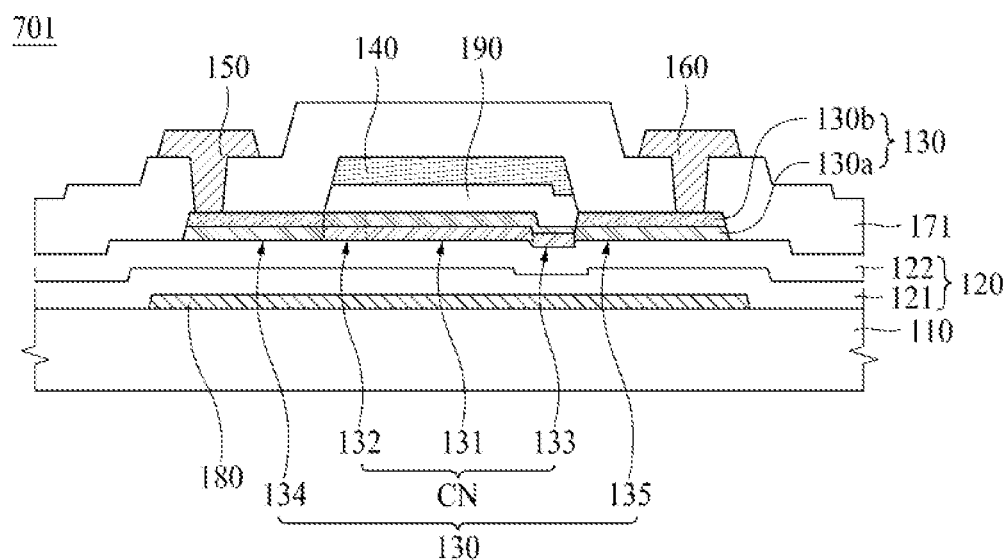
Figure 7C:
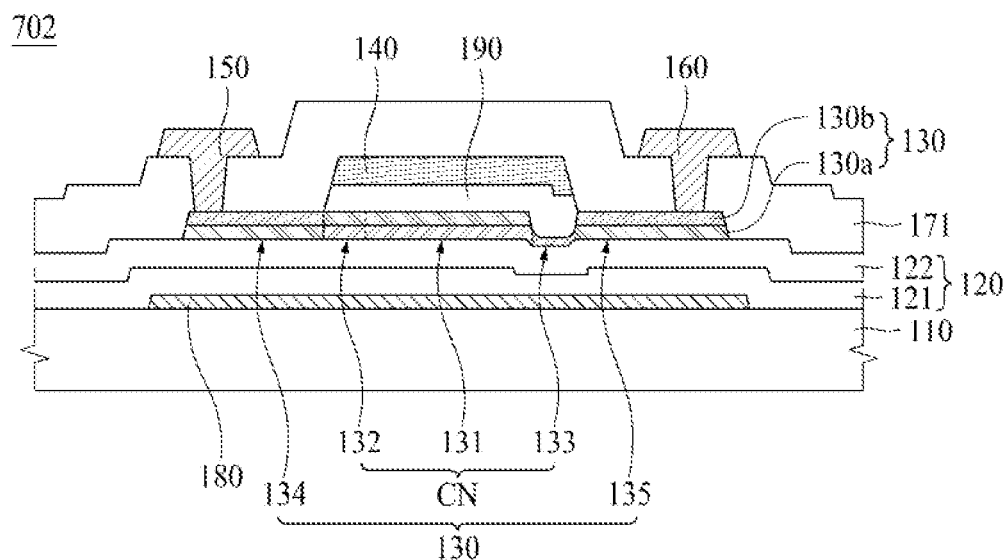

FIGS. 7A, 7B, and 7C are cross-sectional views illustrating a thin film transistor 700, 701, and 702 according to another aspect of the present disclosure.

Referring to FIGS. 7A, 7B, and 7C, an active layer 130 includes a first oxide semiconductor layer 130a, and a second oxide semiconductor layer 130b on the first oxide semiconductor layer 130a. The first oxide semiconductor layer 130a functions as a supporting layer for supporting the second oxide semiconductor layer 130b, and the second oxide semiconductor layer 130b functions as a channel layer. A channel of the active layer 130 is generally formed in the second oxide semiconductor layer 130b.

The first oxide semiconductor layer 130a functioning as the supporting layer has good film stability and good mechanical properties. For realizing the good film stability, the first oxide semiconductor layer 130a may include gallium (Ga). Herein, gallium (Ga) forms a stable bond to oxygen, and gallium oxide has good film stability.

For example, the first oxide semiconductor layer 130a may include at least one among IGZO (InGaZnO)-based oxide semiconductor, IGO(InGaO)-based oxide semiconductor, IGTO(InGaSnO)-based oxide semiconductor, IGZTO(InGaZnSnO)-based oxide semiconductor, GZTO (GaZnSnO)-based oxide semiconductor, GZO(GaZnO)-based oxide semiconductor, and GO(GaO)-based oxide semiconductor.

For example, the second oxide semiconductor layer 130b may be formed of an oxide semiconductor material such as IZO(InZnO)-based oxide semiconductor, IGO(InGaO)-based oxide semiconductor, ITO(InSnO)-based oxide semiconductor, IGZO(InGaZnO)-based oxide semiconductor, IGZTO(InGaZnSnO)-based oxide semiconductor, GZTO (GaZnSnO)-based oxide semiconductor, and ITZO(InSnZnO)-based oxide semiconductor. However, the aspects of the present disclosure are not limited to these materials. The second oxide semiconductor layer 130b may be formed of other oxide semiconductor materials generally known to those in the art.

Referring to FIGS. 7A, 7B, and 7C, at least a part of a drain boundary portion 133 of the active layer 130 has a relatively smaller thickness in comparison to a thickness of a main channel portion 131. For example, according as the second oxide semiconductor layer 130b of the drain boundary portion 133 is partially or totally removed, at least a part of the drain boundary portion 133 may have the relatively smaller thickness in comparison to the thickness of the main channel portion 131.

In case of partially or totally removing the second oxide semiconductor layer 130b positioned in the drain boundary portion 133, even though a high voltage is applied to the area between a gate electrode 140 and a drain electrode 160, an excessive flow of carrier through the drain boundary portion 133 is restricted so that it is possible to prevent a threshold voltage of the thin film transistor from being moved to a negative (−) direction.

According to another aspect of the present disclosure, a halftone mask is used for a step of patterning the active layer 130 by an etching process using photoresist, whereby the second oxide semiconductor layer 130b of the drain boundary portion 133 may be partially removed.

Also, referring to FIGS. 7A, 7B, and 7C, a buffer insulating layer 120 includes a first insulating layer 121, and a second insulating layer 122 on the first insulating layer 121, and at least a part of the first insulating layer 121 overlapping the drain boundary portion 133 have a relatively smaller thickness in comparison to a thickness in other part of the first insulating layer 121 overlapping the main channel portion 131.

Referring to FIGS. 7A, 7B, and 7C, the second oxide semiconductor layer 130b of the drain boundary portion 133 may be partially removed. The second oxide semiconductor layer 130b in the drain boundary portion 133 may have a thickness smaller than a thickness of the second oxide semiconductor layer 130b in the main channel portion 131. The first oxide semiconductor layer 130a may have a same thickness in the main channel portion 131 and in the drain boundary portion 133.

Alternatively, the second oxide semiconductor layer 130b of the drain boundary portion 133 may be completely removed, and the first oxide semiconductor layer 130a of the drain boundary portion 133 may be partially removed. The first oxide semiconductor layer 130a in the drain boundary portion 133 may have a thickness smaller than a thickness of the first oxide semiconductor layer 130a in the main channel portion 131.

Figure 8:
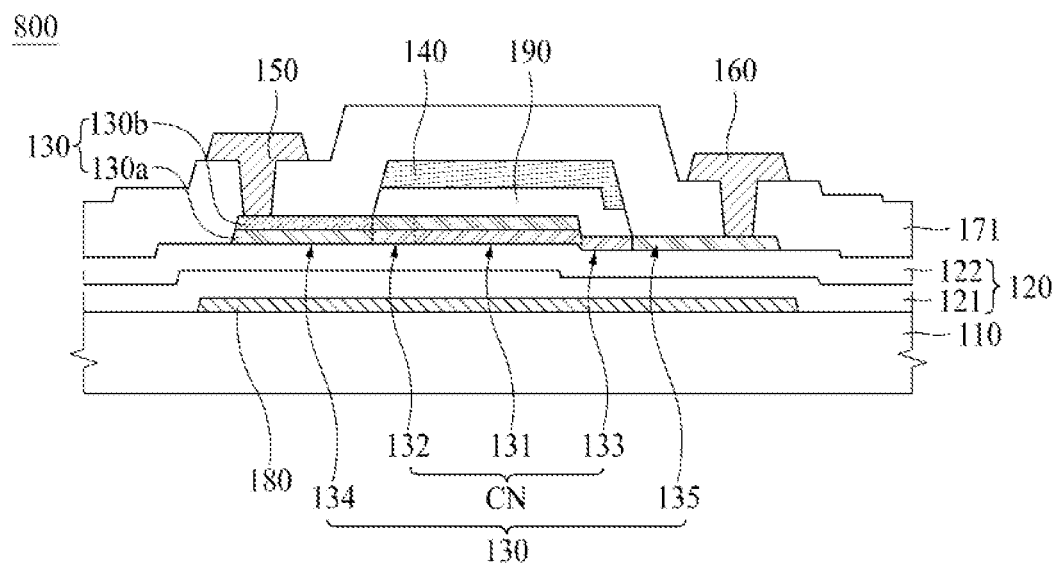
FIG. 8 is a cross-sectional view illustrating a thin film transistor according to another aspect of the present disclosure.

FIG. 8 is a cross-sectional view illustrating a thin film transistor 800 according to another aspect of the present disclosure.

Referring to FIG. 8, an active layer 130 includes a first oxide semiconductor layer 130a, and a second oxide semiconductor layer 130b on the first oxide semiconductor layer 130a. The first oxide semiconductor layer 130a functions as a supporting layer for supporting the second oxide semiconductor layer 130b, and the second oxide semiconductor layer 130b functions as a channel layer.

Also, a drain boundary portion 133 and a second conducting portion 135 in the active layer 130 may have a relatively smaller thickness in comparison to a thickness of a main channel portion 131. In detail, according as the second oxide semiconductor layer 130b is removed from the drain boundary portion 133 and the second conducting portion 135, the thickness of each of the drain boundary portion 133 and the second conducting portion 135 may be smaller than the thickness of the main channel portion 131.

A buffer insulating layer 120 of FIG. 8 includes a first insulating layer 121, and a second insulating layer 122 on the first insulating layer 121, and a part of the first insulating layer 121 overlapping the drain boundary portion 133 and the second conducting portion 135 may have a relatively smaller thickness in comparison to a thickness in other part of the first insulating layer 121 overlapping the main channel portion 131.

Figure 9A:
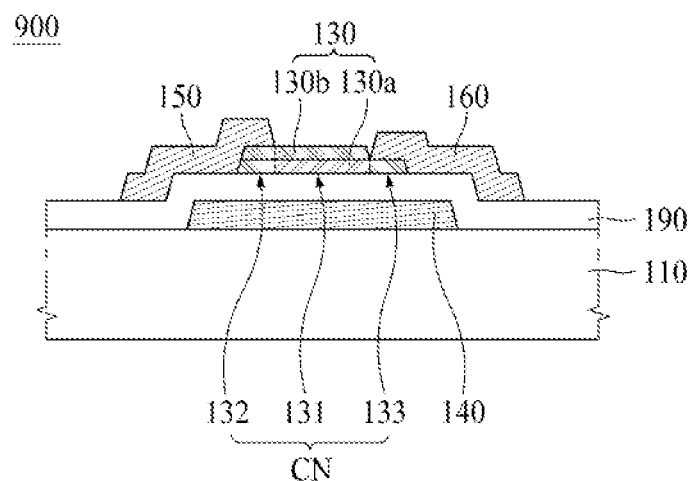
FIGS. 9A and 9B are cross-sectional views illustrating a thin film transistor according to another aspect of the present disclosure.
Figure 9B:
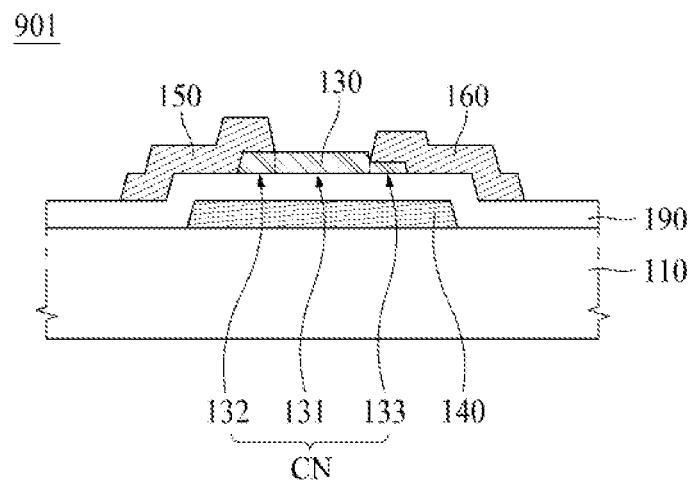

FIGS. 9A and 9B are cross-sectional views illustrating a thin film transistor 900 and 901 according to another aspect of the present disclosure.

The thin film transistor 900 and 901 of FIGS. 9A and 9B includes an active layer 130, a gate electrode 140 configured to be spaced from the active layer 130 and partially overlapped with at least a part of the active layer 130, a source electrode 150 connected with the active layer 130, and a drain electrode 160 configured to be spaced from the source electrode 150 and connected with the active layer 130.

In detail, the thin film transistor of FIGS. 9A and 9B includes a gate electrode 140 on a substrate 110, a gate insulating layer 190 on the gate electrode 140, the active layer 130 on the gate insulating layer 190, the source electrode 150 connected with the active layer 130, and the drain electrode 160 configured to be spaced from the source electrode 150 and the connected with the active layer 130. The gate insulating layer 190 corresponds to an "insulating layer".

As shown in FIGS. 9A and 9B, the above structure where the gate electrode 140 is positioned below the active layer 130 is referred to as a bottom gate structure.

Referring to FIGS. 9A and 9B, the active layer 130 includes a channel portion (CN), wherein the channel portion (CN) includes a source boundary portion 132 connected with the source electrode 150, a drain boundary portion 133 connected with the drain electrode 160, and a main channel portion 131 between the source boundary portion 132 and the drain boundary portion 133. At least a part of the drain boundary portion 133 may have a relatively smaller thickness in comparison to a thickness of the main channel portion 131.

In detail, referring to FIG. 9A, the active layer 130 includes a first oxide semiconductor layer 130a, and a second oxide semiconductor layer 130b on the first oxide semiconductor layer 130a. The first oxide semiconductor layer 130a functions as a channel layer, and the second oxide semiconductor layer 130b functions as a supporting layer. Referring to FIG. 9A, according as the second oxide semiconductor layer 130b is removed from the drain boundary portion 133, a thickness of the drain boundary portion 133 may be smaller than a thickness of the main channel portion 131.

Referring to FIGS. 9A and 9B, the active layer 130 may include a source boundary portion 132, a drain boundary portion 133, and a main channel portion 131. At least a part of the drain boundary portion 133 may have a thickness smaller than a thickness of the main channel portion 131.

Figure 10A:
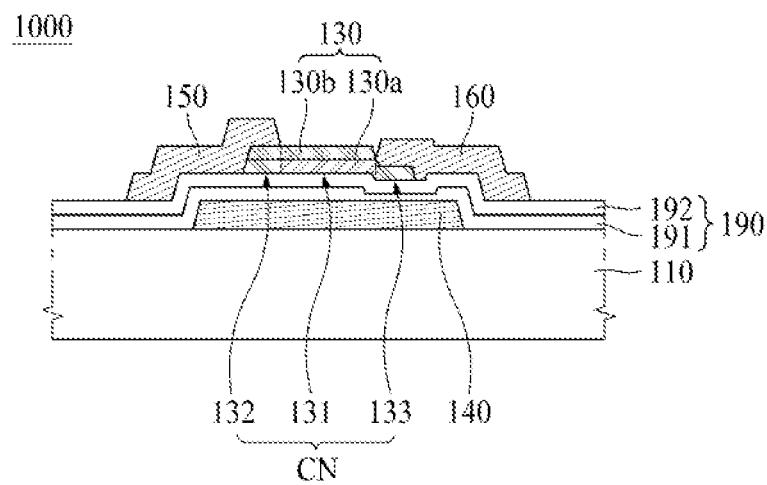
FIGS. 10A and 10B are cross-sectional views illustrating a thin film transistor according to another aspect of the present disclosure.
Figure 10B:
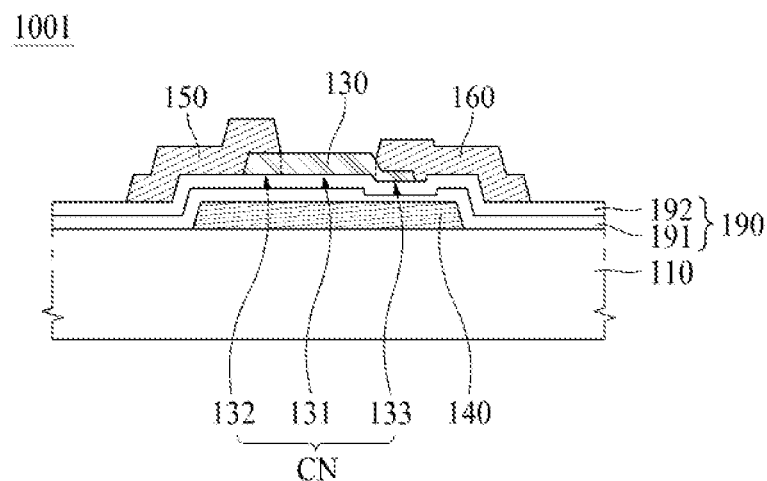

FIGS. 10A and 10B are cross-sectional views illustrating a thin film transistor 1000 and 1001 according to another aspect of the present disclosure.

In comparison to the thin film transistor 900 of FIG. 9A, the thin film transistor 1000 of FIG. 10A has a gate insulating layer 190 with a deposition structure. In detail, the gate insulating layer 190 of FIG. 10A includes a first insulating layer 191, and a second insulating layer 192 on the first insulating layer 191.

The gate insulating layer 190 corresponds to an "insulating layer". Herein, a part of the first insulating layer 191 overlapping a drain boundary portion 133 has a relatively smaller thickness in comparison to a thickness in other part of the first insulating layer 191 overlapping a main channel portion 131.

Referring to FIGS. 10A and 10B, the active layer 130 includes a source boundary portion 132, a drain boundary portion 133, and a main channel portion 131. At least a part of the drain boundary portion 133 may have a thickness smaller than a thickness of the main channel portion 131.

Figure 11A:
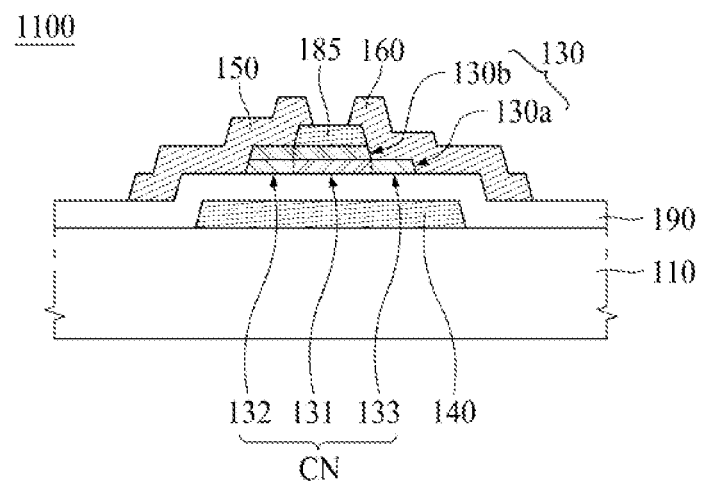
FIGS. 11A and 11B are cross-sectional views illustrating a thin film transistor according to another aspect of the present disclosure.
Figure 11B:
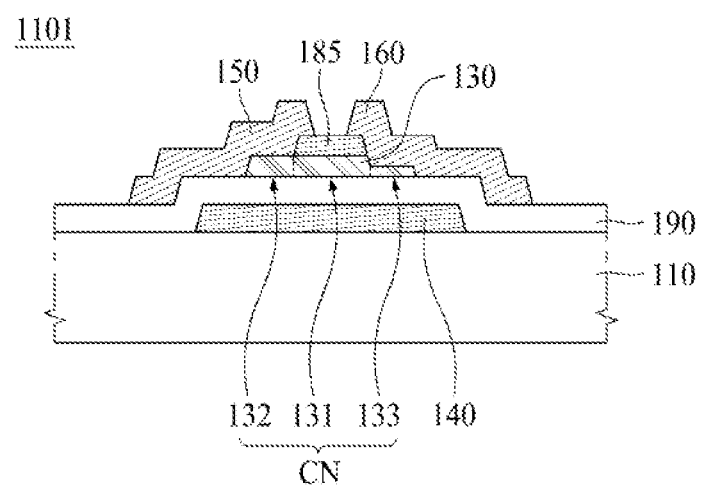

FIGS. 11A and 11B are cross-sectional views illustrating a thin film transistor 1100 and 1101 according to another aspect of the present disclosure.

In comparison to the thin film transistor 900 of FIG. 9A, the thin film transistor 1100 of FIG. 11A may further include an etch stopper 185 disposed on an active layer 130. The etch stopper 185 may be formed of an insulating material. The etch stopper 185 may protect a channel region of the active layer 130.

The active layer 130 includes a source boundary portion 132, a drain boundary portion 133, and a main channel portion 131. At least a part of the drain boundary portion 133 may have a thickness smaller than a thickness of the main channel portion 131.

Figure 12A:
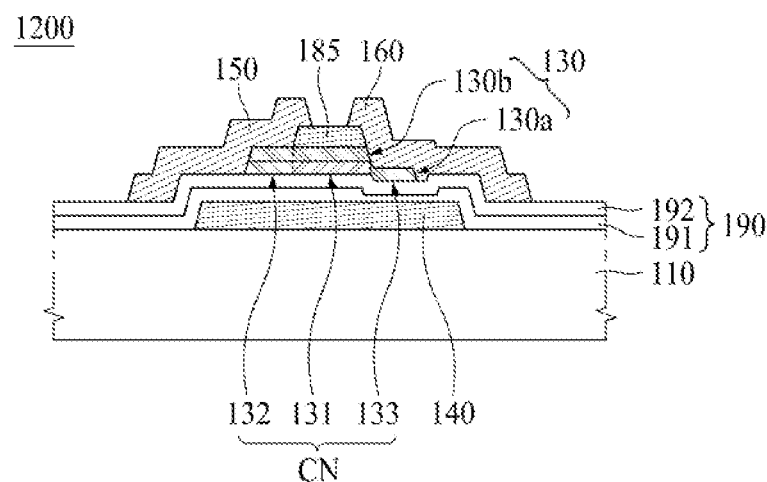
FIGS. 12A and 12B are cross-sectional views illustrating a thin film transistor according to another aspect of the present disclosure.
Figure 12B:
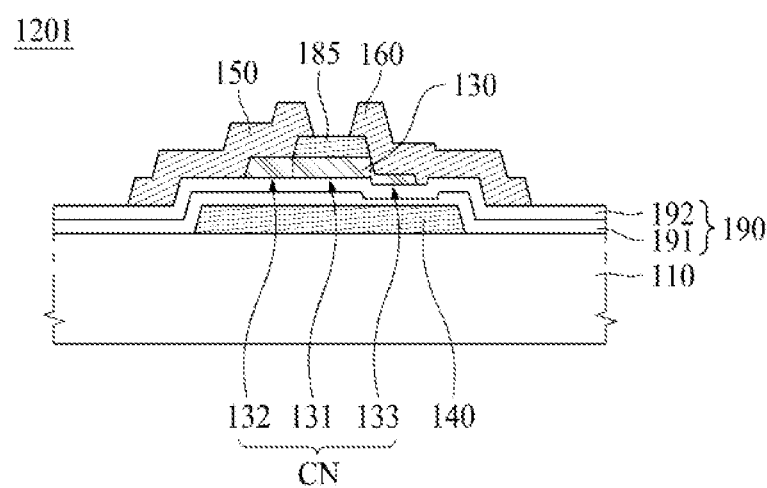

FIGS. 12A and 12B are cross-sectional views illustrating a thin film transistor 1200 and 1201 according to another aspect of the present disclosure.

In comparison to the thin film transistor 1000 of FIG. 10A, the thin film transistor 1200 of FIG. 12A may further include an etch stopper 185 disposed on an active layer 130. The etch stopper 185 may be formed of an insulating material. The etch stopper 185 may protect a channel region of the active layer 130.

The active layer 130 includes a source boundary portion 132, a drain boundary portion 133, and a main channel portion 131. At least a part of the drain boundary portion 133 may have a thickness smaller than a thickness of the main channel portion 131.

Figure 13:
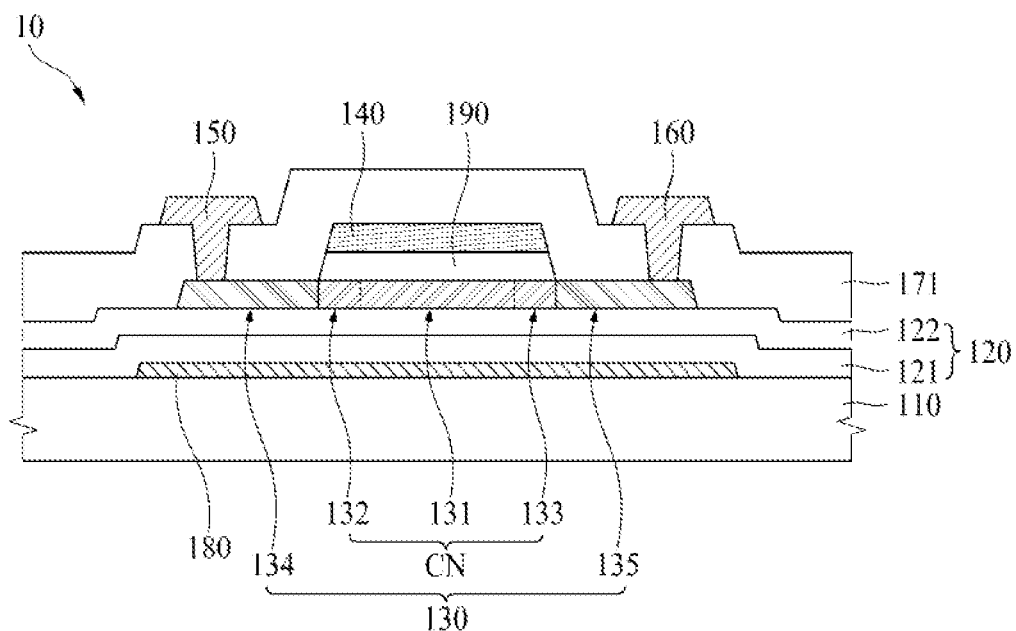
FIG. 13 is a cross-sectional view illustrating a thin film transistor according to the related art.

FIG. 13 is a cross-sectional view illustrating a thin film transistor 10 according to the related art.

The thin film transistor 10 according to the related art includes a metal pattern layer 180 on a substrate 110, a buffer insulating layer 120 on the metal pattern layer 180, an active layer 130 on the buffer insulating layer 120, a gate insulating layer 190 on the active layer 130, a gate electrode 140 on the gate insulating layer 190, an insulating interlayer 171 on the gate electrode 140, and source and drain electrodes 150 and 160 on the insulating interlayer 171.

The active layer 130 includes a channel portion (CN) overlapped with the gate electrode 140, and a first conducting portion 134 and a second conducting portion 135 which are not overlapped with the gate electrode 140. The channel portion (CN) includes a source boundary portion 132 connected with the source electrode 150, a drain boundary portion 133 connected with the drain electrode 160, and a main channel portion 131 between the source boundary portion 132 and the drain boundary portion 133.

In the thin film transistor 10 according to the related art, the main channel portion 131, the source boundary portion 132, the drain boundary portion 133, the first conducting portion 145, and the second conducting portion 135 constituting the active layer 130 are formed as one body, and are configured to have the same thickness.

Figure 14A:
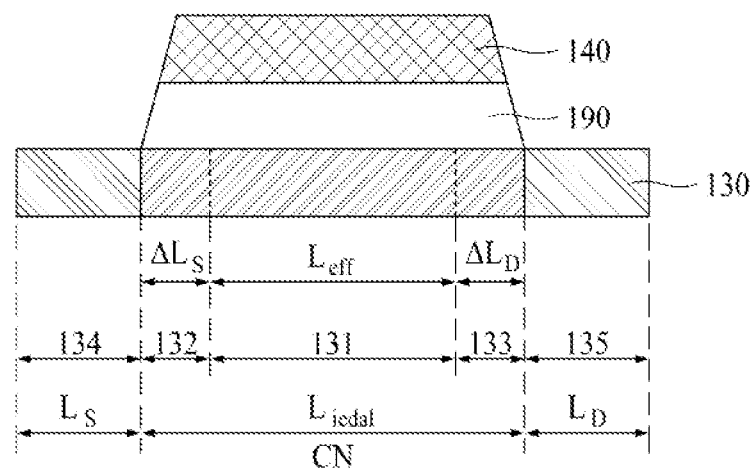
FIG. 14A is a cross-sectional view illustrating each area of an active layer.
Figure 14B:
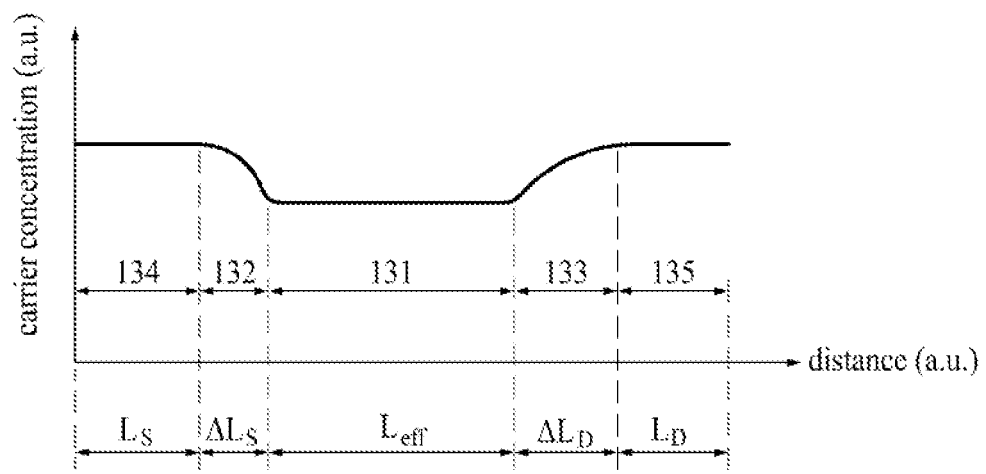
FIG. 14B is a graph illustrating a carrier concentration in each area of the active layer.

FIG. 14A is a cross-sectional view illustrating each area of the active layer 130, and FIG. 14B is a graph illustrating the carrier concentration in each area of the active layer 130.

Generally, the channel of the active layer 130 is formed in the channel portion (CN). However, for the conductivizing process of the first conducting portion 134 and the second conducting portion 135, the carrier concentration is raised in a part of the channel portion (CN) being adjacent to the first conducting portion 134 and the second conducting portion 135, whereby an effective channel length ($L_{eff}$) is smaller than a length ($L_{ideal}$) of the channel portion (CN).

According to one aspect of the present disclosure, for the conductivizing process of the first conducting portion 134 and the second conducting portion 135, a part of the channel portion (CN) being adjacent to each of the first conducting portion 134 and the second conducting portion 135, in which the carrier concentration is raised, are respectively referred to as the source boundary portion 132 and the drain boundary portion 133.

Referring to FIG. 14A, the length of the channel portion (CN) in the active layer 130 is expressed as "Lideal", the length of the first conducting portion 134 is expressed as "LS", and the length of the second conducting portion 135 is expressed as "LD".

For the conductivizing process of the first conducting portion 134 and the second conducting portion 135, conductivity is raised in the edge of the channel portion (CN). In FIG. 14A, a length in each of the first conducting portion 134 and the second conducting portion 135 of the channel portion (CN), in which conductivity is raised, is referred to as a conducting permeation length (ΔLS, ΔLD). Also, a length in the area functioning as the effective channel of the channel portion (CN) is referred to as an effective channel length ($L_{eff}$). If the conducting permeation length (ΔLS, ΔLD) is increased, the effective channel length ($L_{eff}$) is decreased.

FIG. 14B is a graph illustrating the carrier concentration in the active layer 130 of the oxide semiconductor. In FIG. 14B, a horizontal axis corresponds to a distance measured from the end of the left side (Ls) of the active layer 130 shown in FIG. 14A.

Generally, a plasma treatment or hydrogen treatment for the conductivizing process of the first and second conducting portions 134 and 135 is carried out in the surface of the first and second conducting portions 134 and 135, and the source boundary portion 132 and the drain boundary portion 133 partially become conductivized.

As a result, the carrier concentration in the main channel portion 131 is low, and the carrier concentration in the first conducting portion 134 and the second conducting portion 135 is high. Also, the source boundary portion 132 provided between the main channel portion 131 and the first conducting portion 134 and the drain boundary portion 133 provided between the main channel portion 131 and the second conducting portion 135 have a gradient of the carrier concentration.

In order to provide the thin film transistor with a switching function, it is necessary to secure the effective channel length ($L_{eff}$). When the effective channel length ($L_{eff}$) is 2 μm or more than 2 μm, it is possible to prevent the thin film transistor from being deteriorated by a short channel. Thus, according to one aspect of the present disclosure, the main channel portion 131 has a length of 2 μm or more than 2 μm. In more detail, the main channel portion 131 has a length of 42 μm or more than 42 μm.

Figure 15A:
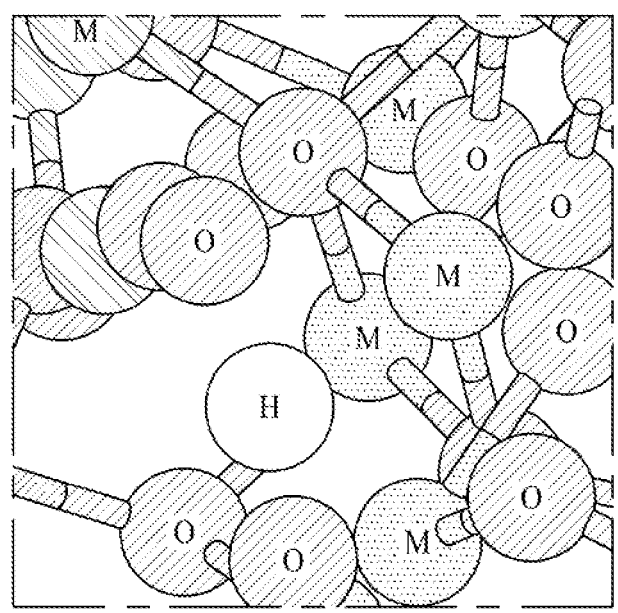
FIGS. 15A and 15B are schematic views illustrating the increase of carrier by oxygen vacancy and hydrogen.
Figure 15B:
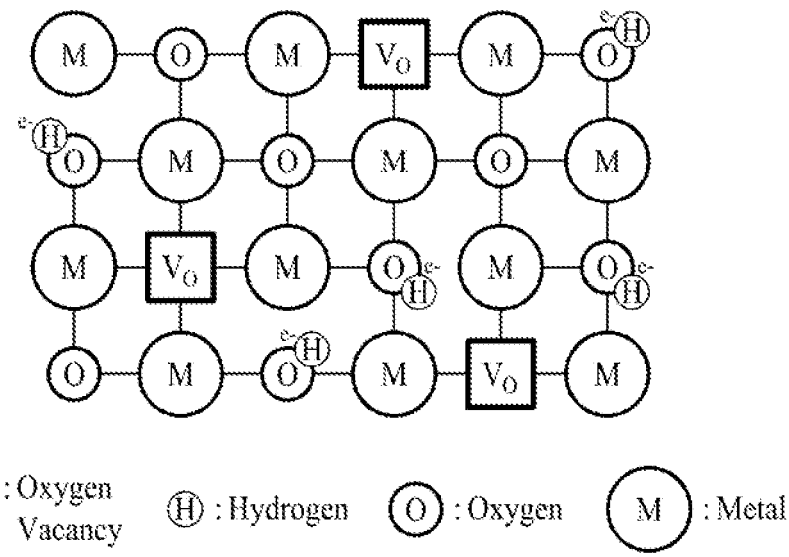

FIGS. 15A and 15B are schematic views illustrating the increase of carrier by oxygen vacancy and hydrogen.

If the oxide semiconductor layer becomes the conductor, oxygen vacancy in the oxide semiconductor layer is increased so that the concentration of hydrogen (H) is increased.

For example, for the conductivizing process of the first conducting portion 134 and the second conducting portion 135, the rate of oxygen vacancy and the hydrogen (H) concentration in the partially-conductivized source boundary portion 132 and drain boundary portion 133 are relatively higher than those in the central portion 131.

Referring to FIGS. 15A and 15B, the source boundary portion 132 and the drain boundary portion 133, which include metal (M) such as indium (In), gallium (Ga) and zinc (Zn), and oxygen (O), have oxygen vacancy (Vo), and also have hydrogen (H) bonded to oxygen (O).

Figure 16:
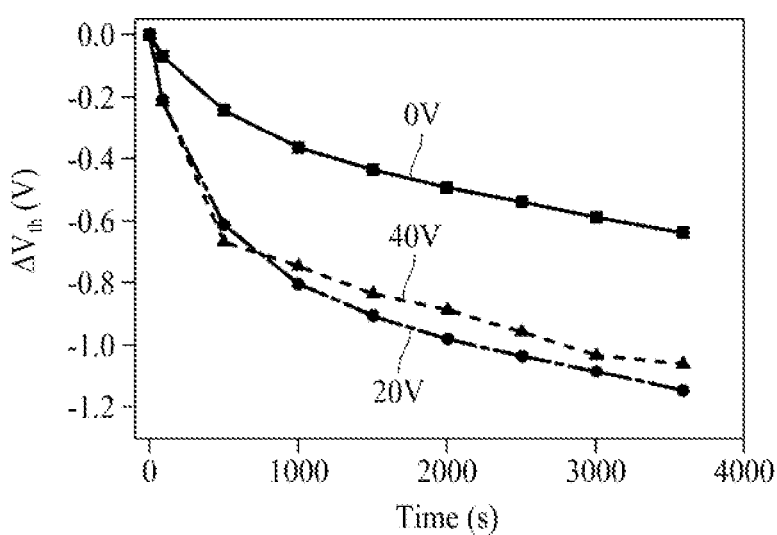
FIG. 16 is a graph illustrating a change of a threshold voltage in accordance with a drain voltage.

FIG. 16 is a graph illustrating a change of threshold voltage in accordance with a drain voltage.

In more detail, FIG. 16 illustrates the change of threshold voltage (ΔVth) measured under the condition of NBTIS (Negative Bias Temperature Illuminance Stress) for the thin film transistor 10 according to the related art. When the drain voltage (Vd) of 0V, 20V and 40V is applied under the condition that the thin film transistor 10 according to the related art is irradiated with light of 4500 nit at a temperature of 60° C., and a voltage of −3V is applied to the gate electrode, the change of threshold voltage (ΔVth) is measured in accordance with the change of time.

Referring to FIG. 16, the threshold voltage is reduced gently if 0V drain voltage (Vd) is applied, meanwhile, the threshold voltage is largely reduced if 20V of drain voltage (Vd) and 40V of drain voltage (Vd) are applied. Accordingly, if the high voltage is applied to the drain electrode 160 of the thin film transistor 10 according to the related art, or if the voltage difference between the drain electrode and the gate electrode becomes large, it is known that it has the large change of threshold voltage (ΔVth).

Accordingly, the thin film transistor 10 according to the related art has the change of the electrical properties based on the drain electrode 160.

Figure 17:
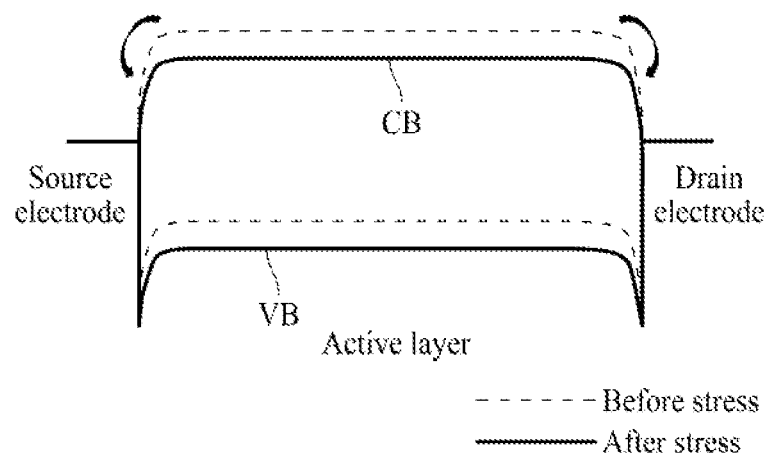
FIG. 17 is an energy band diagram for an active layer of a thin film transistor according to the related art when a low voltage is applied to a drain electrode.

FIG. 17 is an energy band diagram for the active layer 130 of the thin film transistor 10 according to the related art when a low voltage (0V) is applied to the drain electrode. Referring to FIG. 17, in comparison to the state before applying the voltage to the drain electrode (before stress), an energy level of a conduction band (CB) and an energy level of a valence band (VB) are constantly lowered when the low voltage (0V) is applied to the drain electrode (after stress).

Figure 18:
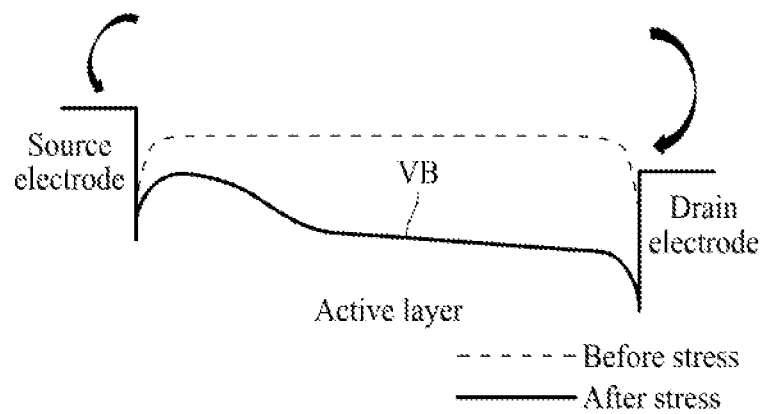
FIG. 18 is an energy band diagram for an active layer of a thin film transistor according to the related art when a high voltage is applied to a drain electrode.

FIG. 18 is an energy band diagram for the active layer 130 of the thin film transistor 10 according to the related art when a high voltage (40V) is applied to the drain electrode. Referring to FIG. 18, in comparison to the state before applying the voltage to the drain electrode, a change in an energy level of a conduction band (CB) and an energy level of a valence band (VB) is not constant. Referring to FIG. 18, in the active layer 130, it is known that the energy level in the area adjacent to the drain electrode 160 is largely reduced in comparison to the energy level in the area adjacent to the source electrode 150. This reduction of energy level relates with the reduction of threshold voltage.

In case of the thin film transistor 10 according to the related art, it is known that the change of electrical properties in the area adjacent to the drain electrode 160 is relatively larger than the change of electrical properties in the area adjacent to the source electrode 150.

In the active layer 130 of the oxide semiconductor material, the hydrogen (H), which is provided from the insulating layer such as the buffer insulating layer 120 or the gate insulating layer 190, is included in the source boundary portion 132 and the drain boundary portion 133. In detail, the hydrogen concentration included in the source boundary portion 132 and the drain boundary portion 133 is relatively higher than the hydrogen concentration included in the main channel portion 131, whereby the oxygen vacancy (Vo) exists in the source boundary portion 132 and the drain boundary portion 133. Accordingly, if the high voltage is applied to the area between the gate electrode 140 and the drain electrode 160, the hydrogen (H) included in the drain boundary portion 133 adjacent to the drain electrode 160 is ionized so that the concentration of carrier is increased. As a result, there is the drop of threshold voltage so that the threshold voltage is moved to the negative (−) direction.

If there is the drop of threshold voltage, driving stability and switching stability of the thin film transistor 100 is lowered. In order to prevent the drop of threshold voltage, according to the aspects of the present disclosure, at least a part of the drain boundary portion 133 is designed to have the relatively smaller thickness in comparison to the thickness of the main channel portion 131. Also, according to the aspects of the present disclosure, the insulating layer overlapped with the drain boundary portion 133 is designed to have the small thickness, whereby the content of hydrogen (H) permeating into the drain boundary portion 133 from the insulating layer is reduced.

As a result, even though the high voltage is applied to the area between the gate electrode 140 and the drain electrode 160, an excessive flow of the carrier through the drain boundary portion 133 is restricted so that it is possible to prevent the threshold voltage of the thin film transistor 100 from being moved to the negative (−) direction.

Figure 19:
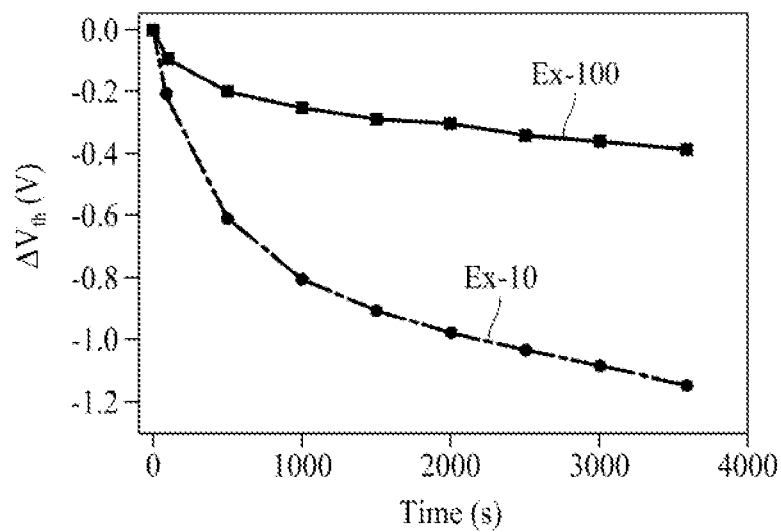
FIG. 19 is a graph illustrating a change of a threshold voltage in a thin film transistor according to the related art and a change of a threshold voltage in a thin film transistor according to one aspect of the present disclosure.

FIG. 19 is a graph illustrating the change of the threshold voltage in the thin film transistor according to the related art and the change of the threshold voltage in the thin film transistor according to one aspect of the present disclosure.

In FIG. 19, "Ex-100" is a graph illustrating the change of the threshold voltage in the thin film transistor 100 of FIG. 1, and "Ex-10" is a graph illustrating the change of the threshold voltage in the thin film transistor 10 according to the related art.

In detail, when the drain voltage (Vd) of 20V is applied to the drain electrode under the condition that the thin film transistor is irradiated with light of 4500 nit at a temperature of 60° C., and a voltage of −3V is applied to the gate electrode, the change of threshold voltage (ΔVth) is measured in accordance with the change of time.

Referring to FIG. 19, while the change of the threshold voltage in the thin film transistor 100 of FIG. 1 is small (Ex-100), the change of the threshold voltage in the thin film transistor 10 according to the related art is large.

Figure 20:
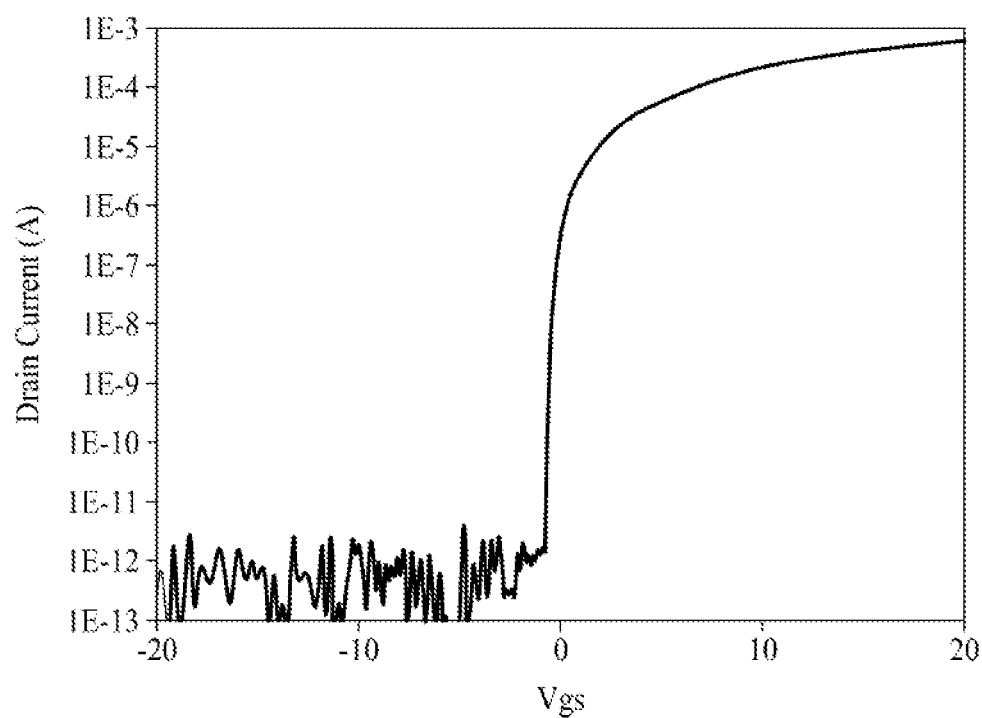
FIG. 20 is a graph illustrating a threshold voltage of a thin film transistor according to one aspect of the present disclosure.

FIG. 20 is a graph illustrating the threshold voltage of the thin film transistor according to one aspect of the present disclosure.

Referring to FIG. 20, in case of the thin film transistor 100 according to one aspect of the present disclosure, the drain boundary portion 133 is partially removed so as to have the small thickness, and the properties in change of the threshold voltage are not degraded.

Thus, the thin film transistor 100 according to one aspect of the present disclosure has the good properties of the threshold voltage, and shows the small change of threshold voltage (ΔVth). The thin film transistor according to one aspect of the present disclosure has the good switching properties and good reliability.

Hereinafter, a display apparatus 1300 according to another aspect of the present disclosure will be described with reference to FIGS. 21 to 24.

The display apparatus 1300 according to another aspect of the present disclosure includes a substrate 110, a pixel driving circuit (PDC) on the substrate 110, and a display unit 710 connected with the pixel driving circuit (PDC). The pixel driving circuit (PDC) includes a thin film transistor. The thin film transistor may use the thin film transistors 100, 200, 300, 400, 500, 600, 700, 800, 900, 1000, 1100 and 1200 shown in FIGS. 1, 2, 3, 4, 5, 6, 7, 8, 9, 10, 11 and 12. Thus, in order to avoid unnecessary repetition, a detailed structure of the thin film transistor included in the display apparatus 1300 will be omitted.

Figure 21:
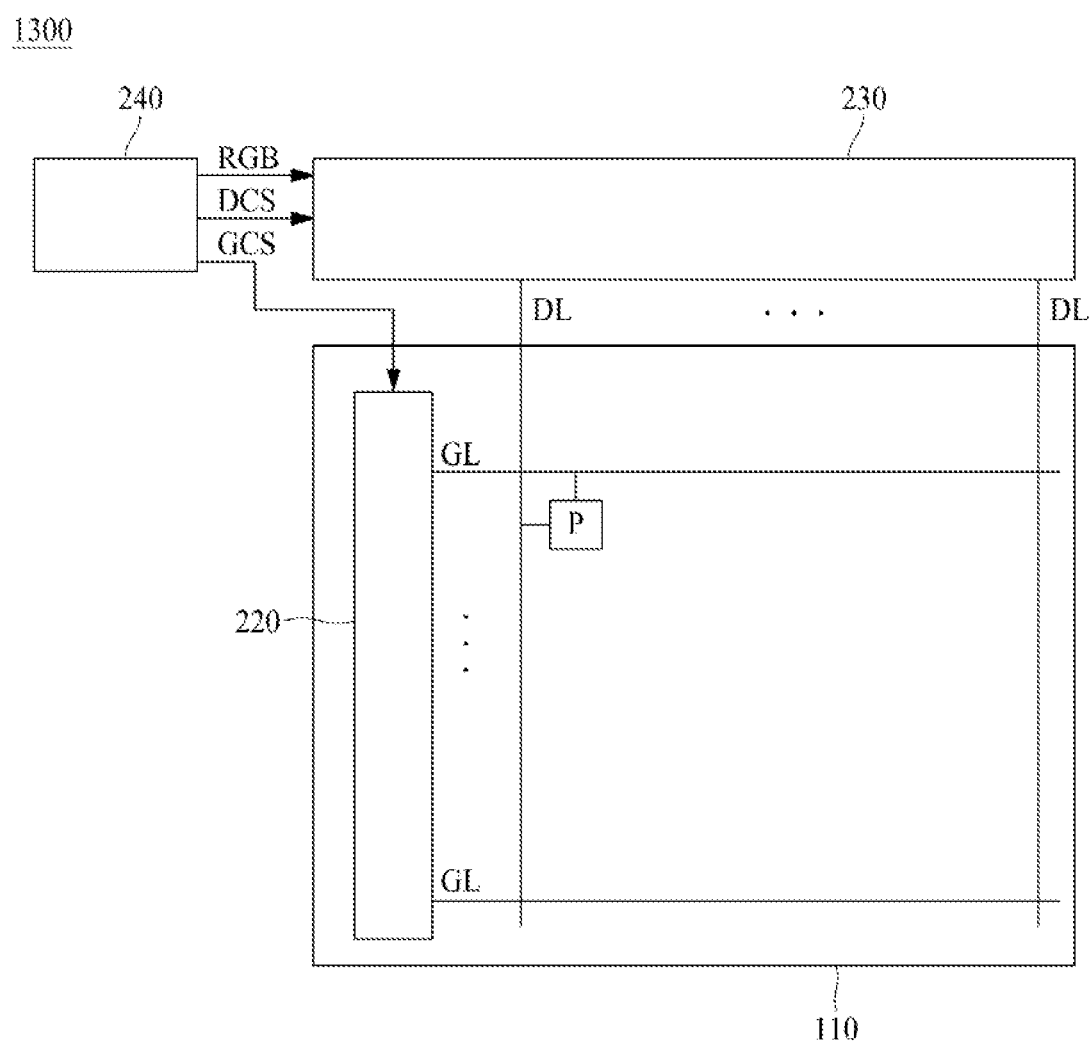
FIG. 21 is a schematic view illustrating a display apparatus according to another aspect of the present disclosure.

FIG. 21 is a schematic view illustrating a display apparatus 1300 according to another aspect of the present disclosure.

As shown in FIG. 21, the display apparatus 1300 according to another aspect of the present disclosure includes a pixel (P) on a substrate 110, a gate driver 220, a data driver 230, and a controller 240.

On the substrate 110, there are gate lines (GL and data lines (DL), and the pixel (P) is arranged at a crossing portion of the gate line (GL) and the data line (DL). The pixel (P) includes the display unit 710, and the pixel driving circuit (PDC) for driving the display unit 710. An image is displayed by driving the pixel (P).

The controller 240 controls the gate driver 220 and the data driver 230.

The controller 240 outputs a gate control signal (GCS) for controlling the gate driver 220 and a data control signal (DCS) for controlling the data driver 230 by the use of vertically/horizontally synchronized signal and clock signal supplied from an external system (not shown). Also, the controller 240 samples input video data, which is provided from the external system, and then re-aligns the sampled video data, and supplies the re-aligned digital video data (RGB) to the data driver 230.

The gate control signal (GCS) includes a gate start pulse (GSP), a gate shift clock (GSC), a gate output enable signal (GOE), a start signal (Vst), and a gate clock (GCLK). Also, control signals for controlling a shift register may be included in the gate control signal (GCS).

The data control signal (DCS) includes a source start pulse (SSP), a source shift clock signal (SSC), a source output enable signal (SOE), and a polarity control signal (POL).

The data driver 230 supplies a data voltage to the data lines (DL) on the substrate 110. In detail, the data driver 230 converts the video data (RGB) provided from the controller 240 into an analog data voltage, and supplies the analog data voltage to the data lines (DL).

The gate driver 220 sequentially supplies a gate pulse (GP) to the gate lines (GL) for 1 frame period. Herein, '1 frame' indicates the period in which one image is output through the display panel. Also, the gate driver 220 supplies a gate-off signal for turning off the switching device to the gate line (GL) for the remaining period of 1 frame in which the gate pulse (GP) is not supplied. Hereinafter, the gate pulse (GP) and the gate-off signal (Goff) are totally referred to as scan signals (SS).

According to one aspect of the present disclosure, the gate driver 220 may be provided on the substrate 110. A structure of directly providing the gate driver 220 on the substrate 110 may be referred to as Gate-In-Panel (GIP) structure.

Figure 22:
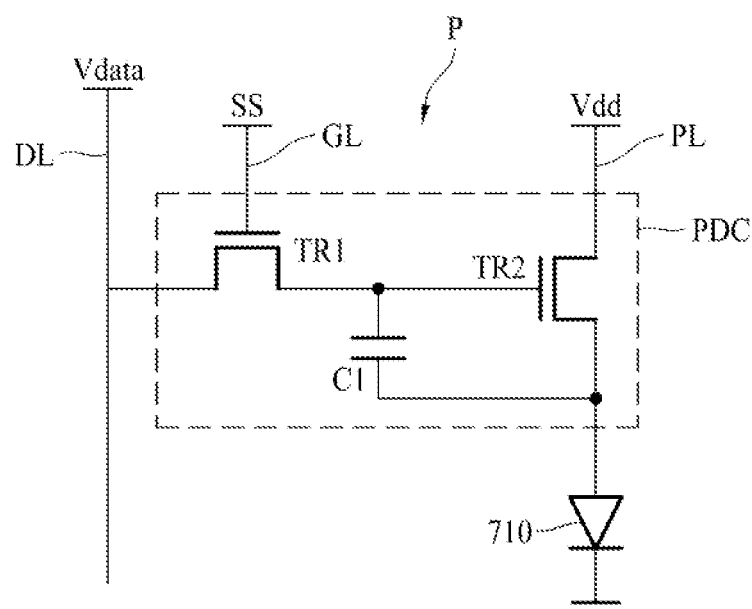
FIG. 22 is a circuit diagram illustrating any one pixel of FIG. 21.
Figure 23:
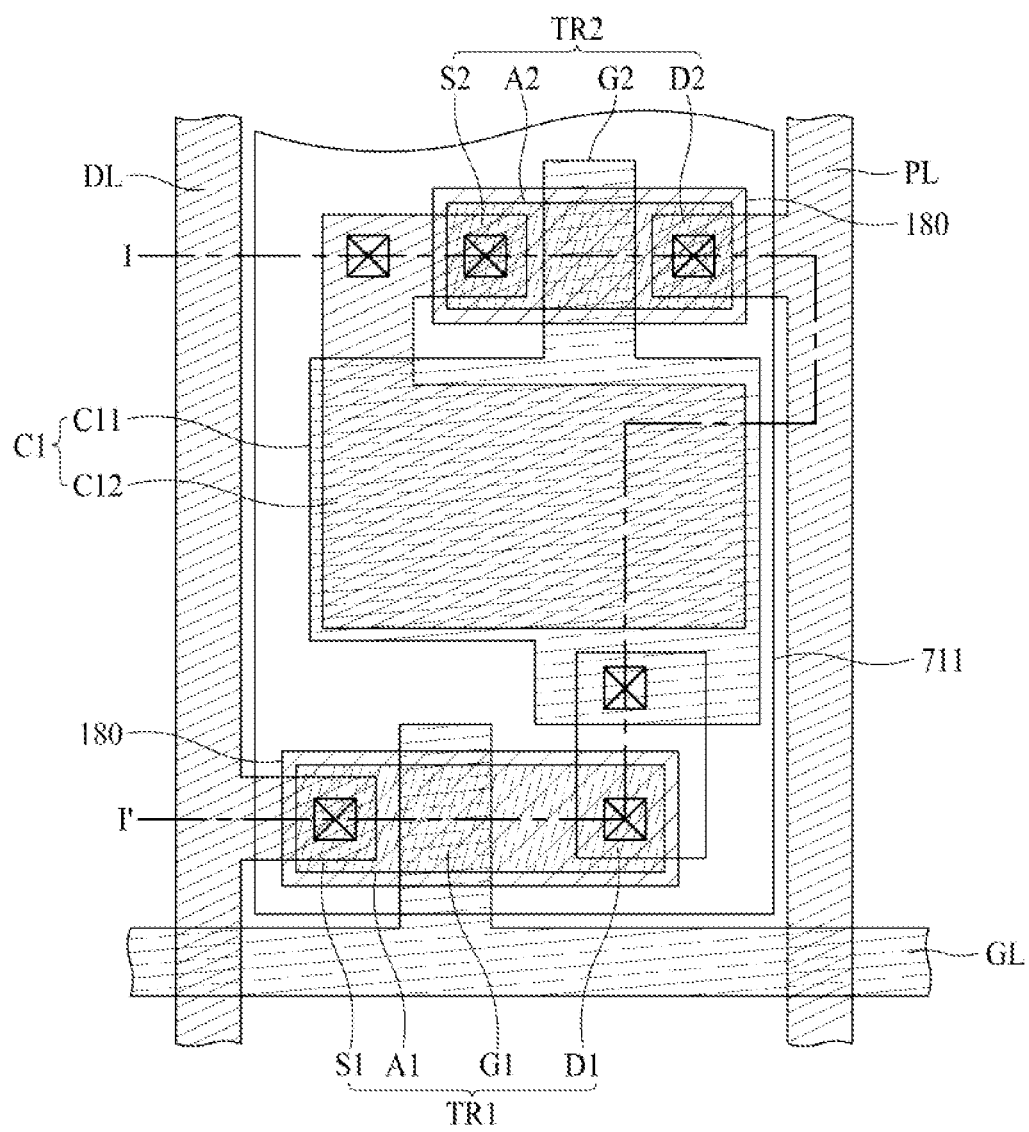
FIG. 23 is a plane view illustrating the pixel of FIG. 22.
Figure 24:
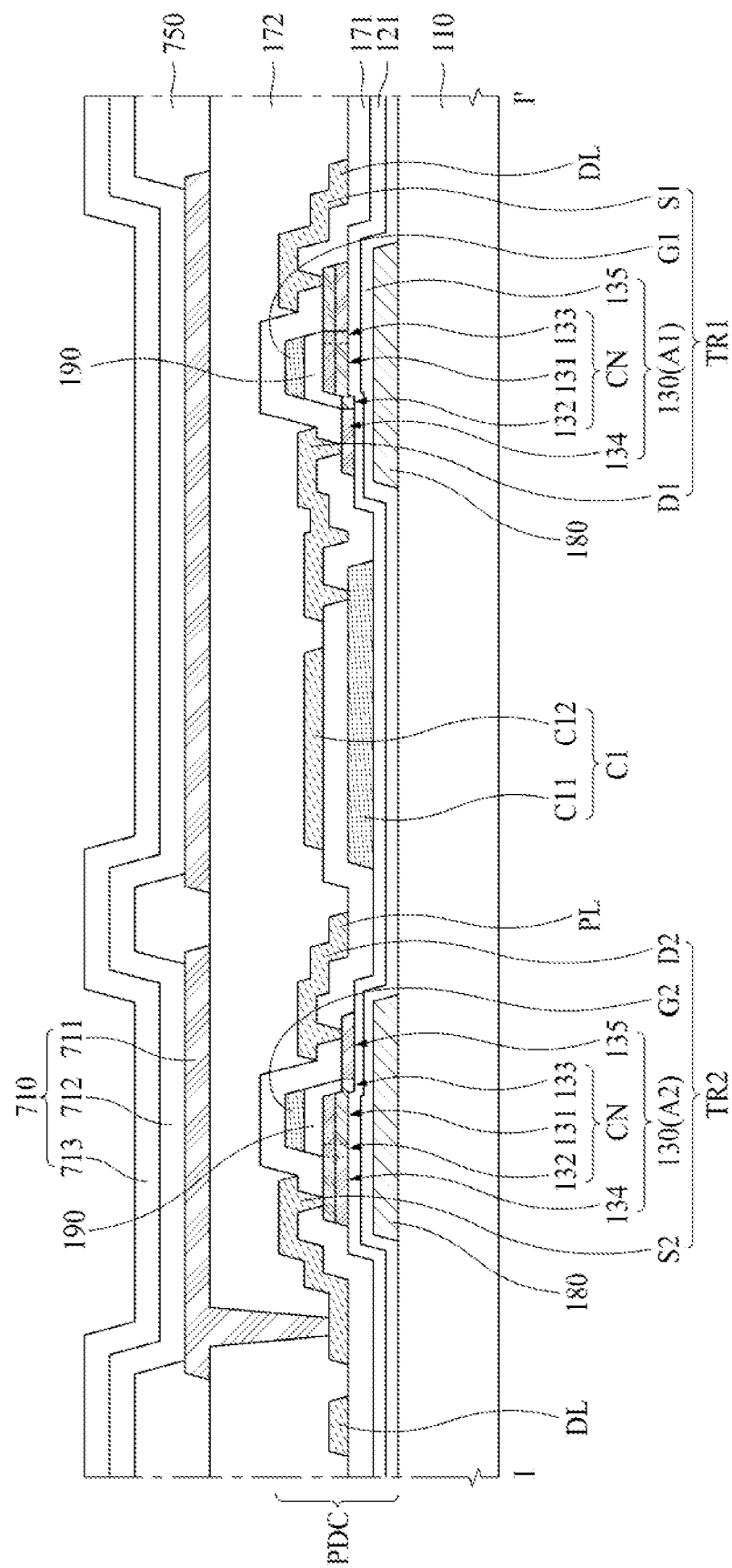
FIG. 24 is a cross-sectional view along line I-I' of FIG. 23.

FIG. 22 is a circuit diagram for any one pixel (P) of FIG. 21, FIG. 23 is a plane view illustrating the pixel (P) of FIG. 22, and FIG. 24 is a cross-sectional view along I-I" of FIG. 23.

The circuit diagram of FIG. 22 corresponds to an equivalent circuit diagram for one pixel (P) in a display apparatus 1330 including an organic light emitting diode (OLED). The pixel driving circuit (PDC) of FIG. 22 includes a first thin film transistor (TR1) corresponding to a switching transistor, and a second thin film transistor (TR2) corresponding to a driving transistor. The first thin film transistor (TR1) corresponding to the driving transistor may use the thin film transistors 100, 200, 300, 400, 500, 600, 700, 800, 900, 1000, 1100 and 1200 shown in FIGS. 1, 2, 3, 4, 5, 6, 7, 8, 9, 10, 11 and 12.

The first thin film transistor (TR1) is connected with the gate line (GL) and the data line (DL), and is turned-on or turned-off by the scan signal (SS) supplied through the gate line (GL).

The data line (DL) provides a data voltage (Vdata) to the pixel driving circuit (PDC), and the first thin film transistor (TR1) controls an application of the data voltage (Vdata).

A driving voltage line (PL) provides a driving voltage (Vdd) to the display unit 710, and the second thin film transistor (TR2) controls the driving voltage (Vdd). The driving voltage (Vdd) corresponds to a pixel driving voltage for driving the organic light emitting diode (OLED) corresponding to the display unit 710.

When the first thin film transistor (TR1) is turned-on by the scan signal (SS) supplied from the gate driver 220 via the gate line (GL), the data voltage (Vdata) supplied via the data line (DL) is applied to the gate electrode (G2) of the second thin film transistor (TR2) connected with the emission device 710. The data voltage (Vdata) is charged in a first capacitor (C1) provided between the gate electrode (G2) of the second thin film transistor (TR2) and the source electrode (S2) of the second thin film transistor (TR2). The first capacitor (C1) corresponds to a storage capacitor (Cst). The first capacitor (C1) includes a first capacitor electrode (C11) connected with the gate electrode (G2) of the second thin film transistor (TR2), and a second capacitor electrode (C12) connected with the source electrode (S2) of the second thin film transistor (TR2).

A supply amount of current supplied to the organic light emitting diode (OLED) corresponding to the display unit 710 through the second thin film transistor (TR2) is controlled in accordance with the data voltage (Vdata), whereby it is possible to control a grayscale of the light emitted from the display unit 710.

Referring to FIGS. 23 and 24, the pixel driving circuit (PDC) is disposed on the substrate 110.

The substrate 110 may be formed of glass or plastic. The substrate 110 may be formed of plastic having flexibility, for example, polyimide (PI).

The pixel driving circuit (PDC) includes a metal pattern layer 180 on the substrate 110, a buffer insulating layer 120 on the metal pattern layer 180, an active layer 130 (A1, A2) on the buffer insulating layer 120, a gate electrode (G1, G2) partially overlapped with at least a part of the active layer 130 (A1, A2), source electrode (S1, S2) and drain electrode (D1, D2) respectively connected with the active layer 130 (A1, A2).

The metal pattern layer 180 functions as a light-shielding layer, and protects the active layer 130 (A1, A2) by preventing external light which is incident on the active layer 130.

The buffer insulating layer 120 is disposed on the metal pattern layer 180. The buffer insulating layer 120 is formed of the insulating material, which protects the active layer 130 (A1, A2) from externally-provided moisture or oxygen.

The active layer (A1) of the first thin film transistor (TR1) and the active layer (A2) of the second thin film transistor (TR2) are disposed on the buffer insulating layer 120.

The active layer (A1) of the first thin film transistor (TR1) and the active layer (A2) of the second thin film transistor (TR2) include a channel portion (CN), wherein the channel portion (CN) includes a source boundary portion 132 connected with the source electrode 150, a drain boundary portion 133 connected with the drain electrode 160, and a main channel portion 131 between the source boundary portion 132 and the drain boundary portion 133. At least a part of the drain boundary portion 133 may have a relatively smaller thickness in comparison to a thickness of the main channel portion 131.

Also, the active layer 130 may include a first oxide semiconductor layer 130a, and a second oxide semiconductor layer 130b on the first oxide semiconductor layer 130a.

A gate insulating layer 190 is disposed on the active layer 130. The gate insulating layer 190 has the insulating properties.

The gate electrode (G1, G2) is disposed on the gate insulating layer 190. The gate electrode (G1, G2) may be the areas extending from the gate line (GL), or may be a part of the gate line (GL).

An insulating interlayer 171 is disposed on the gate electrode (G1, G2).

The source electrode (S1, S2) and the drain electrode (D1, D2) are disposed on the insulating interlayer 171. According to one aspect of the present disclosure, the source electrode (S1, S2) and the drain electrode (D1, D2) are distinguished from each other for convenience of explanation, however, the source electrode (S1, S2) and the drain electrode (D1, D2) are used interchangeably. Thus, the source electrode (S1, S2) may be the drain electrode (D1, D2), and the drain electrode (D1, D2) may be the source electrode (S1, S2).

According to one aspect of the present disclosure, the source electrode (S1) and the drain electrode (D1) included in the first thin film transistor (TR1) are spaced apart from each other, and are connected with the active layer (A1) of the first thin film transistor (TR1). The source electrode (S2) and the drain electrode (D2) included in the second thin film transistor (TR2) are spaced apart from each other, and are connected with the active layer (A2) of the second thin film transistor (TR2).

Also, the data line (DL) and a driving power line (PL) are disposed on the insulating interlayer 171. According to one aspect of the present disclosure, the source electrode (S1) of the first thin film transistor (TR1) is connected with the data line (DL). The drain electrode (D2) of the second thin film transistor (TR2) is connected with the driving power line (PL).

As shown in FIG. 24, the first thin film transistor (TR1) includes the active layer (A1), the gate electrode (G1), the source electrode (S1), and the drain electrode (D1), and the first thin film transistor (TR1) functions as the switching transistor for controlling the data voltage (Vdata) applied to the pixel driving circuit (PDC).

The second thin film transistor (TR2) includes the active layer (A2), the gate electrode (G2), the source electrode (S2), and the drain electrode (D2), and the second thin film transistor (TR2) functions as the driving transistor for controlling the driving voltage (Vdd) applied to the display unit 710.

A planarization layer 172 is disposed on the source electrode (S1, S2), the drain electrode (D1, D2), the data line (DL), and the driving power line (PL). The planarization layer 172 is configured to planarize an upper surface of the first thin film transistor (TR1) and an upper surface of the second thin film transistor (TR2), and also to protect the first thin film transistor (TR1) and the second thin film transistor (TR2).

A first electrode 711 of the display unit 710 is disposed on the planarization layer 172. The first electrode 711 of the display unit 710 may be connected with the source electrode (S2) of the second thin film transistor (TR2) via a contact hole provided in the planarization layer 172.

A bank layer 750 is disposed in the edge of the first electrode 711. The bank layer 750 defines an emission area of the display unit 710.

An organic emission layer 712 is disposed on the first electrode 711, and a second electrode 713 is disposed on the organic emission layer 712, whereby the display unit 710 is completed. The display unit 710 shown in FIG. 24 corresponds to the organic light emitting diode (OLED). Accordingly, the display apparatus 100 according to one aspect of the present disclosure corresponds to the organic light emitting display device.

Figure 25:
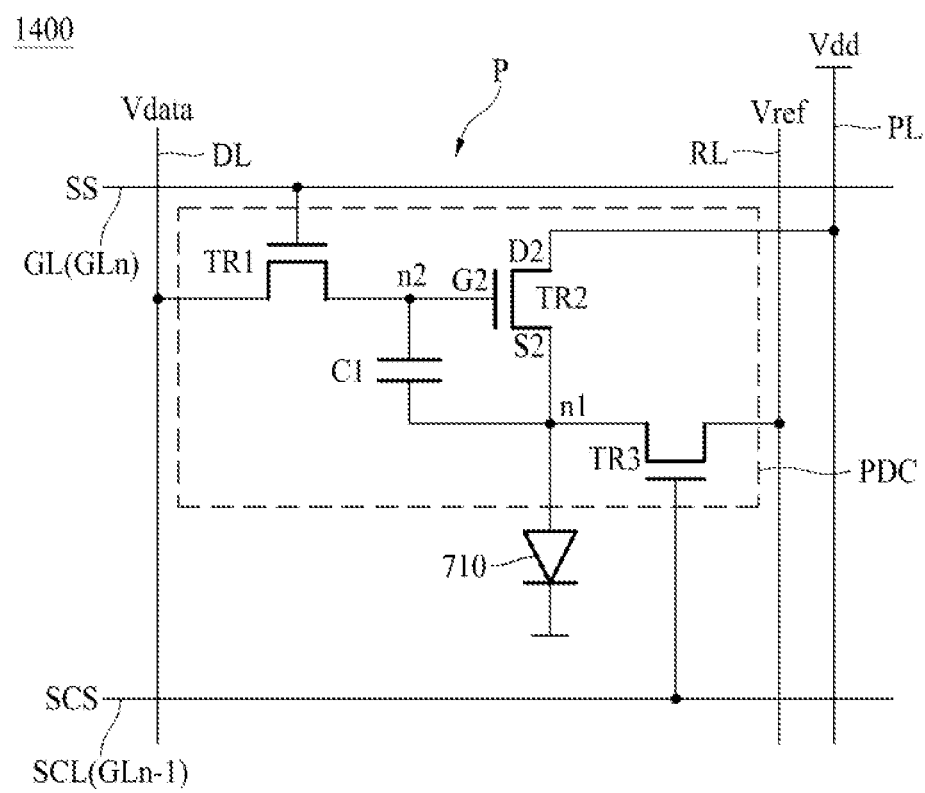
FIG. 25 is a circuit diagram illustrating a pixel of a display apparatus according to another aspect of the present disclosure.

FIG. 25 is a circuit diagram illustrating any one pixel (P) of a display apparatus 1400 according to another aspect of the present disclosure. FIG. 25 is an equivalent circuit diagram for a pixel (P) of an organic light emitting display device.

The pixel (P) of the display apparatus 1400 shown in FIG. 25 includes an organic light emitting diode (OLED) corresponding to a display unit 710, and a pixel driving circuit (PDC) for driving the display unit 710. The display unit 710 is connected with the pixel driving circuit (PDC).

In the pixel (P), there are signal lines (DL, GL, PL, RL, SCL) for supplying a signal to the pixel driving circuit (PDC).

A data voltage (Vdata) is supplied to a data line (DL), a scan signal (SS) is supplied to a gate line (GL), a driving voltage (VDD) for driving the pixel is supplied to a driving voltage line (PL), a reference voltage (Vref) is supplied to a reference line (RL), and a sensing control signal (SCS) is supplied to a sensing control line (SCL).

Referring to FIG. 25, when the gate line of the (n)th pixel (P) is referred to as "GLn", the gate line of the neighboring (n-1)th pixel (P) is "GLn-1", and the gate line of the (n-1)th pixel (P) serves as the sensing control line (SCL) of the (n)th pixel (P).

The pixel driving circuit (PDC) includes a first thin film transistor (TR1, switching transistor) connected with the gate line (GL) and the data line (DL), a second thin film transistor (TR2, driving transistor) configured to control a level of current which is provided to the display unit 710 in accordance with the data voltage (Vdata) transmitted through the first thin film transistor (TR1), and a third thin film transistor (TR3, reference transistor) configured to sense the properties of the second thin film transistor (TR2).

A first capacitor (C1) is positioned between the display unit 710 and a gate electrode (G2) of the second thin film transistor (TR2). The first capacitor (C1) is referred to as a storage capacitor (Cst).

The first thin film transistor (TR1) is turned-on by the scan signal (SS) supplied to the gate line (GL), and the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL) and a first node (n1) between the emission device 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and a gate electrode (G2) of the second thin film transistor (TR2) is charged with the data voltage (Vdata).

When the second thin film transistor (TR2) is turned-on, a current is supplied to the emission device 710 through the second thin film transistor (TR2) by the driving voltage (Vdd) for driving the pixel, whereby light is emitted from the emission device 710.

The first thin film transistor (TR1), the second thin film transistor (TR2), and the third thin film transistor (TR3) shown in FIG. 25 may be identical in structure to any one among the thin film transistors 100, 200, 300, 400, 500, 600, 700, 800, 900, 1000, 1100 and 1200 shown in FIGS. 1 to 12.

Figure 26:
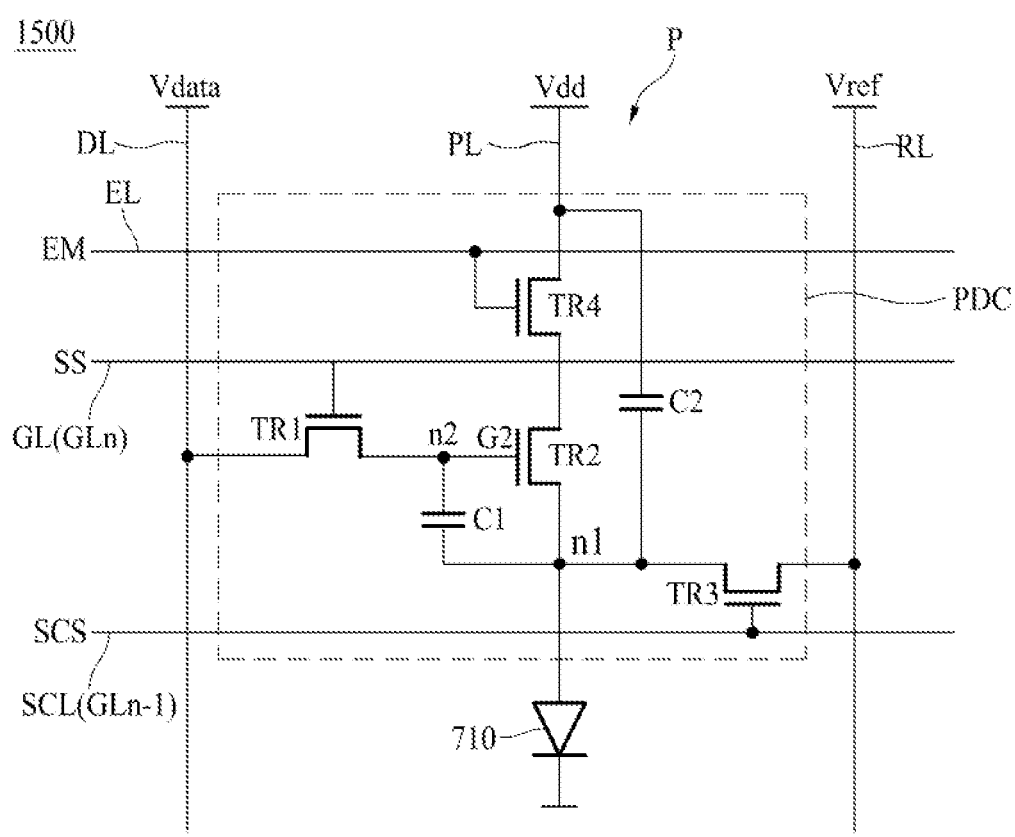
FIG. 26 is a circuit diagram illustrating a pixel of a display apparatus according to another aspect of the present disclosure.

FIG. 26 is a circuit diagram illustrating a pixel of a display apparatus 1500 according to another aspect of the present disclosure.

The pixel (P) of the display apparatus 1500 shown in FIG. 26 includes an organic light emitting diode (OLED) corresponding to a display unit 710, and a pixel driving circuit (PDC) for driving the display unit 710. The display unit 710 is connected with the pixel driving circuit (PDC).

The pixel driving circuit (PDC) includes thin film transistors (TR1, TR2, TR3, TR4).

In the pixel (P), there are signal lines (DL, EL, GL, PL, SCL, RL) for supplying a signal to the pixel driving circuit (PDC).

In comparison to the pixel (P) of FIG. 25, the pixel (P) of FIG. 26 further includes an emission control line (EL). An emission control signal (EM) is supplied to the emission control line (EL).

Also, in comparison to the pixel driving circuit (PDC) of FIG. 25, the pixel driving circuit (PDC) of FIG. 26 further includes a fourth thin film transistor (TR4) corresponding to an emission control transistor configured to control an emission time point of the second thin film transistor (TR2).

Referring to FIG. 26, when the gate line of the (n)th pixel (P) is referred to as "GLn", the gate line of the neighboring (n-1)th pixel (P) is "GLn-1", and the gate line of the (n-1)th pixel (P) serves as the sensing control line (SCL) of the (n)th pixel (P).

A first capacitor (C1) is positioned between the display unit 710 and a gate electrode (G2) of the second thin film transistor (TR2). Also, a second capacitor (C2) is positioned between one electrode of the display unit 710 and a terminal supplied with a driving voltage (Vdd) among a plurality of terminals.

The first thin film transistor (TR1) is turned-on by the scan signal (SS) supplied to the gate line (GL), and the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL), and is turned-on or turned-off by the sensing control signal (SCS), and the third thin film transistor (TR3) senses the properties of the second thin film transistor (TR2) corresponding the driving transistor for a sensing period.

The fourth thin film transistor (TR4) transmits the driving voltage (Vdd) to the second thin film transistor (TR2) or blocks the driving voltage (Vdd) in accordance with the emission control signal (EM). When the fourth thin film transistor (TR4) is turned-on, a current is supplied to the second thin film transistor (TR2), whereby light is emitted from the display unit 710.

The first thin film transistor (TR1), the second thin film transistor (TR2), the third thin film transistor (TR3) and the fourth thin film transistor (TR4) shown in FIG. 26 may be identical in structure to any one among the thin film transistors 100, 200, 300, 400, 500, 600, 700, 800, 900, 1000, 1100 and 1200 shown in FIGS. 1 to 12.

The pixel driving circuit (PDC) according to another aspect of the present disclosure may be formed in various structures in addition to the above-described structure. For example, the pixel driving circuit (PDC) may include five thin film transistors, or more than five.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin film transistor comprising:
   a gate electrode on a substrate;
   an active layer spaced apart from the gate electrode and overlapping at least a part of the gate electrode, the active layer including a channel portion;
   a gate insulating layer disposed between the active layer and the gate electrode; and
   source and drain electrodes connected with the active layer and spaced apart from each other,
   wherein the gate electrode is between the substrate and the active layer, and
   wherein the channel portion includes,
   a first boundary portion connected with one of the source and drain electrodes;
   a second boundary portion connected with the other one of the source and drain electrodes; and
   a main channel portion interposed between the first boundary portion and the second boundary portion,
   wherein at least a part of the second boundary portion has a thickness smaller than a thickness of the main channel portion, and
   wherein at least a first part of the gate insulating layer overlapping the second boundary portion has a thickness smaller than a thickness in a second part of the gate insulating layer that overlaps the main channel portion.

2. The thin film transistor according to claim 1, wherein the first boundary portion has a same thickness as that of the main channel portion.

3. The thin film transistor according to claim 1, wherein the at least a part of the second boundary portion has the thickness of less than or equal to 50% of the thickness of the main channel portion.

4. The thin film transistor according to claim 1, wherein a portion of the gate insulating layer that overlaps the second boundary portion has a same thickness as another portion of the gate insulating layer that overlaps with the main channel portion.

5. The thin film transistor according to claim 1, wherein the gate insulating layer includes:
   a first insulating layer; and
   a second insulating layer on the first insulating layer.

6. The thin film transistor according to claim 5, wherein at least a first part of the first insulating layer overlapping the second boundary portion has a thickness smaller than a thickness in a second part of the first insulating layer that overlaps the main channel portion.

7. The thin film transistor according to claim 6, wherein a portion of the second insulating layer that overlaps the second boundary portion has a same thickness as another portion of the second insulating layer that overlaps with the main channel portion.

8. The thin film transistor according to claim 1, wherein a portion of the gate electrode that overlaps the second boundary portion has a same thickness as another portion of the gate electrode that overlaps the main channel portion.

9. The thin film transistor according to claim 1, wherein the active layer includes a first oxide semiconductor layer and a second oxide semiconductor layer disposed on the first oxide semiconductor layer.

10. The thin film transistor according to claim 9, wherein the first oxide semiconductor layer has a same thickness in the main channel portion and in the second boundary portion.

11. The thin film transistor according to claim 9, wherein the second oxide semiconductor layer in the second boundary portion has a thickness smaller than a thickness of the second oxide semiconductor layer in the main channel portion.

12. The thin film transistor according to claim 1, wherein an upper surface of the first boundary portion contacts one of the source and drain electrodes, and
   an upper surface of the second boundary portion contacts the other one of the source and drain electrodes.

13. The thin film transistor according to claim 12, wherein the main channel portion does not contact the source and drain electrodes.

14. The thin film transistor according to claim 1, wherein the main channel portion is between an area of the active layer contacting the source electrode and the other area of the active layer contacting the drain electrode.

15. The thin film transistor according to claim 1, further comprising an etch stopper disposed on an active layer.

16. The thin film transistor according to claim 15, wherein the etch stopper overlaps the main channel portion.

* * * * *